(12) United States Patent
Lou et al.

(10) Patent No.: US 11,263,964 B2
(45) Date of Patent: Mar. 1, 2022

(54) DISPLAY PANEL, DISPLAY SCREEN, AND DISPLAY TERMINAL

(71) Applicant: Yungu (Gu'an) Technology Co., Ltd., Langfang (CN)

(72) Inventors: Junhui Lou, Langfang (CN); Yanqin Song, Langfang (CN)

(73) Assignee: YUNGU (GU'AN) TECHNOLOGY CO., LTD., Langfang (CN)

( * ) Notice: Subject to any disclaimer, the term of this patent is extended or adjusted under 35 U.S.C. 154(b) by 0 days.

(21) Appl. No.: 16/872,314

(22) Filed: May 11, 2020

(65) Prior Publication Data
US 2020/0273400 A1 Aug. 27, 2020

Related U.S. Application Data

(63) Continuation of application No. PCT/CN2019/072628, filed on Jan. 22, 2019.

(30) Foreign Application Priority Data

Sep. 30, 2018 (CN) .......................... 201811163242.7

(51) Int. Cl.
H01L 27/32 (2006.01)
G09G 3/3225 (2016.01)
(Continued)

(52) U.S. Cl.
CPC ....... G09G 3/3225 (2013.01); H01L 27/3246 (2013.01); H01L 27/3262 (2013.01);
(Continued)

(58) Field of Classification Search
CPC ............. H01L 27/3246; H01L 27/3262; H01L 27/3279
(Continued)

(56) References Cited

U.S. PATENT DOCUMENTS 10,211,227 B2 2/2019 Kim et al.
2004/0164668 A1* 8/2004 Kanno .................. H01L 27/322
313/500
(Continued)

FOREIGN PATENT DOCUMENTS

CN 101364604 A 2/2009
CN 102023431 A 4/2010
(Continued)

OTHER PUBLICATIONS

First Office Action of Chinese Application No. 2018111632427.
(Continued)

Primary Examiner — Dzung Tran
(74) Attorney, Agent, or Firm — Kilpatrick Townsend & Stockton

(57) ABSTRACT

The present application relates to a display panel, a display screen and a display terminal. The display panel comprises a substrate provided with pixel circuits thereon; a pixel-defining layer; a light-emitting structure layer; a first electrode layer disposed on the pixel circuits and comprising a plurality of first electrodes; a second electrode disposed on the light emitting structure layer and being a surface electrode; and a scanning line and a data line both connected to each of the pixel circuits; wherein, sub-pixels in adjacent sub-pixel rows are staggered with one another and/or sub-pixels in adjacent sub-pixel columns are staggered with one another; the scanning line supplies a voltage to the pixel circuit to control turning-on and turning-off of the pixel circuit, and when the pixel circuit is turned on, a drive current from the data line is directly supplied to the first electrode to control light-emitting of the corresponding sub-pixel.

18 Claims, 17 Drawing Sheets

(51) Int. Cl.
   *H01L 51/56*  (2006.01)
   *H01L 27/12*  (2006.01)
   *H01L 29/786*  (2006.01)

(52) U.S. Cl.
   CPC ...... *H01L 27/3272* (2013.01); *H01L 27/3279* (2013.01); *H01L 51/56* (2013.01); *G09G 2300/0426* (2013.01); *G09G 2320/043* (2013.01); *H01L 27/124* (2013.01); *H01L 27/1225* (2013.01); *H01L 29/7869* (2013.01); *H01L 29/78633* (2013.01); *H01L 29/78675* (2013.01); *H01L 29/78678* (2013.01); *H01L 2227/323* (2013.01)

(58) Field of Classification Search
   USPC .......................................................... 257/40
   See application file for complete search history.

(56) References Cited

U.S. PATENT DOCUMENTS

| | | | |
|---|---|---|---|
| 2005/0231447 A1 | 10/2005 | Hu et al. | |
| 2006/0087227 A1* | 4/2006 | Yamanaka | H01L 27/3213 313/504 |
| 2006/0097628 A1* | 5/2006 | Suh | H01L 27/3211 313/504 |
| 2006/0170111 A1 | 8/2006 | Isa et al. | |
| 2006/0194500 A1 | 8/2006 | Ishii | |
| 2007/0229554 A1* | 10/2007 | Kawasaki | G09G 3/30 345/694 |
| 2009/0040408 A1 | 2/2009 | Ishii | |
| 2009/0140253 A1* | 6/2009 | Kasahara | G02F 1/134336 257/59 |
| 2009/0195534 A1 | 8/2009 | Kasai | |
| 2010/0289977 A1 | 11/2010 | Liu | |
| 2011/0042676 A1 | 2/2011 | Ren | |
| 2011/0163329 A1 | 7/2011 | Kim et al. | |
| 2012/0313098 A1* | 12/2012 | Kim | H01L 51/5012 257/59 |
| 2014/0292622 A1 | 10/2014 | Lee | |
| 2015/0130868 A1 | 5/2015 | Feng | |
| 2016/0218120 A1 | 7/2016 | Yamazaki et al. | |
| 2017/0154563 A1 | 6/2017 | Lin | |
| 2018/0151658 A1 | 5/2018 | Jeong et al. | |
| 2018/0260079 A1 | 9/2018 | Zhang | |
| 2019/0074471 A1 | 3/2019 | Abe et al. | |
| 2019/0393286 A1 | 12/2019 | Ding et al. | |

FOREIGN PATENT DOCUMENTS

| | | |
|---|---|---|
| CN | 101887897 A | 11/2010 |
| CN | 103268049 A | 8/2013 |
| CN | 103745684 A | 4/2014 |
| CN | 104218070 A | 12/2014 |
| CN | 105154823 A | 12/2015 |
| CN | 105511132 A | 4/2016 |
| CN | 105552102 A | 5/2016 |
| CN | 107505767 A | 12/2017 |
| CN | 206893217 U | 1/2018 |
| CN | 107819018 A | 3/2018 |
| CN | 207425858 U | 5/2018 |
| CN | 108122958 A | 6/2018 |
| CN | 108269504 A | 7/2018 |
| CN | 108376696 A | 8/2018 |
| CN | 108565281 A | 9/2018 |
| EP | 1655781 A2 | 5/2006 |
| JP | 62168115 A | 7/1987 |
| JP | 11330481 A | 11/1999 |
| JP | 2001100657 A | 4/2001 |
| JP | 2002148604 A | 5/2002 |
| JP | 2005182005 A | 7/2005 |
| JP | 2005316467 A | 11/2005 |
| JP | 2006237586 A | 9/2006 |
| JP | 2006245031 A | 9/2006 |
| JP | 2009065498 A | 3/2009 |
| JP | 2009211035 A | 9/2009 |
| KR | 20150028059 A | 3/2015 |
| KR | 1020180007028 A | 1/2018 |
| TW | 201125119 A | 7/2011 |
| TW | I545740 B | 8/2016 |
| WO | 2017195560 A1 | 11/2017 |

OTHER PUBLICATIONS

Extended Search Report of European Application No. 19865447.7.
International Search Report for Application No. PCT/CN2019/072628.
Written Opinion for Application No. PCT/CN2019/072628.
First Office Action of Taiwan Application No. 108103907.
Decision of Grant of Taiwan Application No. 108103907.
First office action for corresponding Japanese Application No. 2020-541558.
First Office Action of Korean Application No. 10-2020-7021967.

* cited by examiner

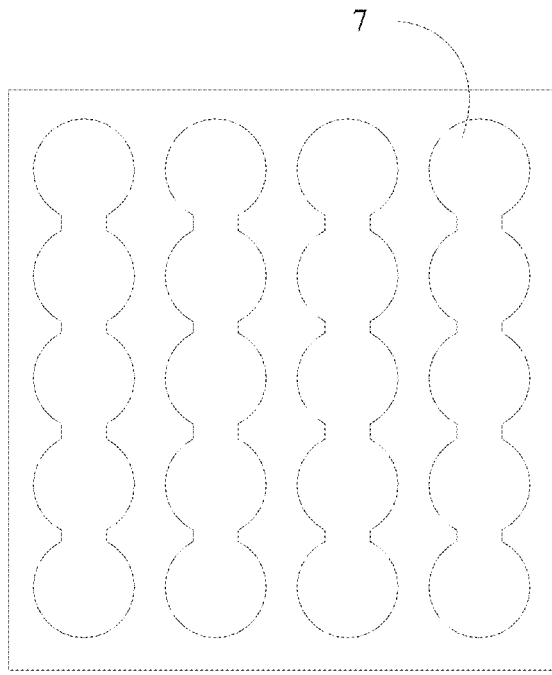

Figure 11

| Switching devices, scanning lines and data lines are formed; each of the switching devices comprises a first terminal, a second terminal and a control terminal, respectively, the data line is connected to the first terminal of the switching device, and the scanning line is connected to the control terminal of the switching device. | S1 |

| A first electrode, a pixel-defining layer, a light emitting structure layer and a second electrode are correspondingly formed on each of the plurality of switching devices, the plurality of light emitting structure layers share the second electrode, and the first electrodes corresponding to the plurality of light emitting structure layers are respectively connected to the second terminals of the respective switching devices. | S2 |

Figure 12

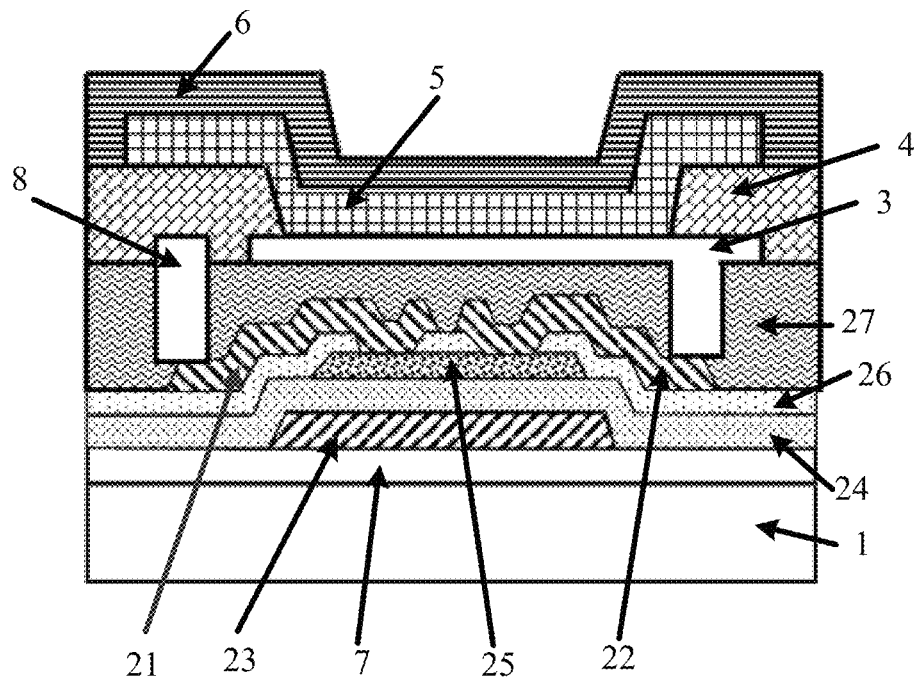

Figure 18

| A corresponding first electrode is formed on the drain electrode of the thin film transistor, and the first electrode is connected to the drain electrode. | S21 |

↓

| A pixel-defining layer is formed on the first electrodes. | S22 |

↓

| A light-emitting structure layer having a one-to-one correspondence with the first electrode is formed on the pixel-defining layer. | S23 |

↓

| A second electrode is formed on the light-emitting structure layer, and the plurality of light-emitting structure layers share the common second electrode. | S24 |

Figure 19

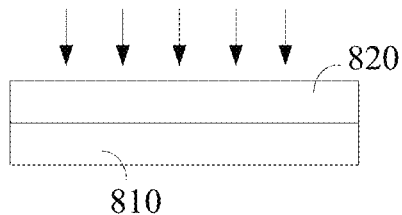
Figure 22
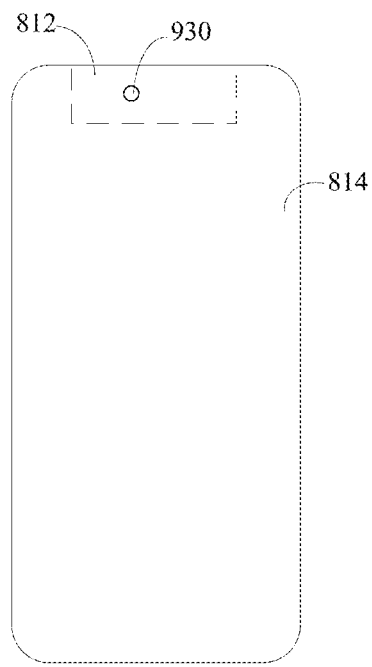
Figure 23
| Transmitting a scanning signal to a scanning line, so that the scanning line controls a row of the pixel circuits to be turned on simultaneously | S231 |
↓
| Transmitting a data signal to a data line such that, when the pixel circuit is turned on, the data line supplies a drive current to the first electrode to control light-emitting of the sub-pixel. | S232 |
Figure 24

Transmitting a first scanning signal to a scanning line in a first display area, so that the scanning line controls a row of pixel circuits to be turned on simultaneously. — S271

Transmitting a first data signal to a data line in the first display area, so that when the pixel circuit is turned on, the data line supplies a drive current to the first electrode to control light-emitting of the sub-pixel. — S272

Transmitting a second scanning signal to a scanning line in the second display area, and transmitting a second data signal to a data line in the second display area, and the first scanning signal and the second scanning signal are synchronized. — S273

Figure 28

DISPLAY PANEL, DISPLAY SCREEN, AND DISPLAY TERMINAL

CROSS-REFERENCE TO RELATED APPLICATIONS

The present application is a continuation of International Application No. PCT/CN2019/072628, filed on Jan. 22, 2019, which claims priority to Chinese Patent Application No. 201811163242.7, filed on Sep. 30, 2018. Both applications are incorporated by reference herein in their entireties for all purposes.

TECHNICAL FIELD

The present application relates to the field of display technology.

BACKGROUND

With rapid development of display terminals, users have an increasingly high level of demands for screen ratio. Since components such as cameras, sensors, earpieces, etc. need to be installed on the top of the screen, a certain area on the top of the screen, such as the front bangs area of the screen of the Apple iPhone X, is usually reserved for installing the above components. Such configuration influences the overall consistency of the screen and thereby influencing the user experience, therefore, full screen display with better overall consistency has received more and more attention in the industry.

SUMMARY

Thus, aimed at solving the above technical problem, the present application provides a display panel for a full display screen, a display screen and a display terminal.

For this, the present application provides the following technical solutions:

According to a first aspect, the embodiments of the present application provide a display panel, comprising a substrate having a plurality of pixel circuits provided thereon; a pixel-defining layer having a plurality of first openings defined therein; a light-emitting structure layer disposed in the plurality of first openings to form a plurality of sub-pixels; a first electrode layer disposed on the pixel circuits and comprising a plurality of first electrodes; a second electrode disposed on the light emitting structure layer and being a surface electrode; and a scanning line and a data line both connected to each of the pixel circuits; wherein, the plurality of sub-pixels form a plurality of sub-pixel rows and a plurality of sub-pixel columns, sub-pixels in adjacent sub-pixel rows are staggered with one another and/or sub-pixels in adjacent sub-pixel columns are staggered with one another; the pixel circuits have a one-to-one correspondence relationship with the first electrodes, and the sub-pixels have a one-to-one correspondence relationship with the first electrodes; the scanning line supplies a voltage to the pixel circuit to control turning-on and turning-off of the pixel circuit, and when the pixel circuit is turned on, a drive current from the data line is directly supplied to the first electrode to control light-emitting of the corresponding sub-pixel.

Optionally, the first electrodes of the sub-pixels are disposed on the same layer as the data line, and the first electrodes and the data line are formed in a same process step, and the data line is disposed between the corresponding first electrodes, and the data line extends along an extending direction not parallel to the sides of the first electrodes.

Optionally, the data line is disposed below the first electrodes, a projection of the data line on the substrate is a first projection, and a projection of each sub-pixel of the light emitting structure layer on the substrate is a second projection, and each of the first projections traverses multiple ones of the second projections.

Optionally, the pixel circuit only comprises a switching device.

Optionally, the pixel circuit comprises one switching device, and the switching device comprises a first terminal, a second terminal, and a control terminal; and the scanning line is connected to the control terminal of the switching device, the data line is connected to the first terminal of the switching device, and the first electrode is connected to the second terminal of the switching device.

Optionally, the first electrode is an anode, the second electrode is a cathode; the switching device is a driving thin film transistor (TFT), and the first terminal is a source electrode or a drain electrode of the driving thin film transistor, the second terminal is a drain electrode or a source electrode of the driving thin film transistor, the control terminal is a gate electrode of the driving thin film transistor; and the driving thin film transistor has a top gate structure or a bottom gate structure; and the driving thin film transistor is an oxide thin film transistor or a low temperature polycrystalline silicon thin film transistor.

Optionally, one or more of the first electrode, the second electrode, the data line and the scanning line are made of a transparent conductive material; and the transparent conductive material has a light transmittance of greater than 90%.

Optionally, the transparent conductive material is indium tin oxide, indium zinc oxide, silver-doped indium tin oxide, or silver-doped indium zinc oxide.

Optionally, when the gate electrode is made of a transparent conductive material, the scanning line and the gate electrode are formed in the same process step; or, when the gate electrode is made of a metal material, the scanning line is disposed above or below the gate electrode.

Optionally, at least one scanning line extends along a first direction, at least one data line extends along a second direction, the first direction intersects with the second direction.

Optionally, adjacent scanning lines have a first distance therebetween, and the first distance changes continuously or intermittently; and/or adjacent data lines have a second distance therebetween, and the second distance changes continuously or intermittently.

Optionally, a width of the scanning line changes continuously or intermittently; and/or a width of the data line changes continuously or intermittently.

Optionally, both sides of the scanning line in the extending direction thereof have a wave shape, and wave crests of the two sides of the scanning line are oppositely disposed, and wave troughs of the two sides of the scanning line are oppositely disposed; and/or both sides of the data line in the extending direction thereof have a wave shape, and wave crests of the two sides of the data line are oppositely disposed, and wave troughs of the two sides of the data line are oppositely disposed.

Optionally, a first connecting portion is formed at a position where the wave troughs of the two sides of the scanning line are oppositely disposed, the first connecting portion is strip-shaped, and the first connecting portion is an area electrically connecting the scanning line to the switching device; and/or a second connecting portion is formed at a position where the wave troughs of the two sides of the data line are oppositely disposed, the second connecting portion is strip-shaped, and the second connecting portion is an area electrically connecting the data line to the switching device.

According to a second aspect, the embodiments of the present application provide a display screen, comprising at least a first display area and a second display area used to display a dynamic or static image, and a photosensitive device being disposed below the first display area; wherein the first display area is provided with the display panel of the first aspect of the present application or any embodiment of the first aspect, and the second display area is provided with a passive matrix organic light emitting diode (PMOLED) display panel or an active matrix organic light emitting diode (AMOLED) display panel.

Optionally, the first display area has a resolution lower than that of the second display area; a pixel-defining layer defines a plurality of first openings in the first display area, and defines a plurality of second openings in the second display area, and each of the second openings has an area smaller than that of each of the first openings; first sub-pixels having number and positions corresponding to that of the first openings are formed in the first display area, and second sub-pixels having number and positions corresponding to that of the second openings are formed in the second display area.

Optionally, when the second display area is provided with an active matrix organic light emitting diode display panel, the cathode of the display panel of the first display area and the cathode of the display panel of the second display area share one overall surface electrode.

According to a third aspect, the embodiments of the present application provide a display terminal comprising an apparatus body having a device area; a display screen according to the second aspect of the present application or any embodiment of the second aspect, covering the apparatus body; wherein the device area is located below the first display area, and the device area is provided with a photosensitive device to collect light passing through the first display area.

Optionally, the device area is a slotted region; and the photosensitive device comprises a camera and/or a light sensor.

The technical solution of this application has the following advantages:

The display panel provided in the embodiments of the present application has a full-screen design, and on the display panel above the camera, the pixel circuits and the sub-pixels have a one-to-one correspondence relationship for driving, such that the number of transistors for driving the Organic Light-Emitting Diodes (OLEDs) is reduced and the transparency of the display screen is increased. In addition, considering the sub-pixel arrangement in the display screen is not aligned in rows or columns, a special wiring design is provided, such that, at the same time of achieving a high transparency of the display panel, a diffraction phenomenon of external incident light diffracting between the data line and the first electrode (preferably an anode) is prevented, thereby improving the photographing effect of the full screen, preventing mutual interference between the data line and the first electrode, and prolonging the service life of the display panel.

BRIEF DESCRIPTION OF THE DRAWINGS

In order to more clearly illustrate the specific embodiments of the present application or the technical solutions in the prior art, the drawings used for describing the specific embodiments or the prior art will be briefly introduced below. Apparently, the appended drawings referred to in the following description only represent some examples of the present application, and a person skilled in the art can obtain other drawings based on these drawings without expenditure of creative labor.

FIG. 11 is a schematic view showing another specific example of scanning lines of a display panel in the embodiments of the present application, with shapes different from the scanning lines of FIG. 9.

FIG. 12 is a flow chart showing a specific example of a method for forming a display panel in the embodiments of the present application.

FIG. 18 is a structural view showing another specific example of a display panel formed by the method for forming a display panel in the embodiments of the present application.

FIG. 19 is a flow chart showing a specific example of forming a plurality of sub-pixels having a one-to-one correspondence relationship with a plurality of switching devices on the plurality of switching devices in the method for forming a display panel in the embodiments of the present application.

FIG. 22 is a schematic structural view of a specific example of a display terminal in the embodiments of the present application.

FIG. 23 is a schematic structural view of an apparatus body in the embodiments of the present application.

FIG. 24 is a flow chart of a specific example of the method for driving a display panel in the embodiments of the present application.

FIG. 28 is a flow chart showing a specific example of a method for driving a display screen in the embodiments of the present application.

DETAILED DESCRIPTION

In order to make the objectives, technical solutions and advantages of the present application more clear, the present application will be further described in detail below with reference to the appended drawings and the embodiments. It should be understood that the specific embodiments described herein are merely illustrative of the present application and are not intended to limit the scope of the present application.

As described in the background part, how to achieve full screen display has received more and more attention in the industry. In order to achieve full screen display, the display screen needs to have a certain level of transparency to meet the requirements of the components such as a camera regarding the transparency of the display screen. When the transparent screen is a PMOLED screen, indium tin oxide (ITO) is used to make the wiring of the cathode and anode of the Organic Light Emitting Diode (OLED), which can significantly improve the transparency of the screen. However, the electrode resistance of ITO is relatively large, and at the same time, in the driving mode for a PM-OLED screen, the wiring in a row direction needs to withstand the current of the entire row of sub-pixel OLEDs, and an instant current of each sub-pixel thereof is much higher than that of each sub-pixel in an AMOLED screen, and the ITO electrode with a high electrical resistance cannot withstand such a large current. Although a cathode made of Ag or Mg/Ag has an increased current load capacity because the electrode resistance of Ag or Mg/Ag is much lower than that of ITO, the transparency of the display screen would be significantly reduced. When the transparent screen is an AMOLED screen, a large number of transistors are required to drive the OLEDs, with complicated metal wiring, and the metal wiring seriously adversely influences the transparency of the display screen.

In consideration of this, the present application provides a display panel which is disposed above a camera. The pixel circuits and the sub-pixels provided in the display panel have a one-to-one correspondence relationship for driving, and the pixel circuit has a simple design with only a switching device, thereby reducing the number of transistors required for driving the sub-pixels, and thus increasing the transparency of the display screen.

Figure 1:
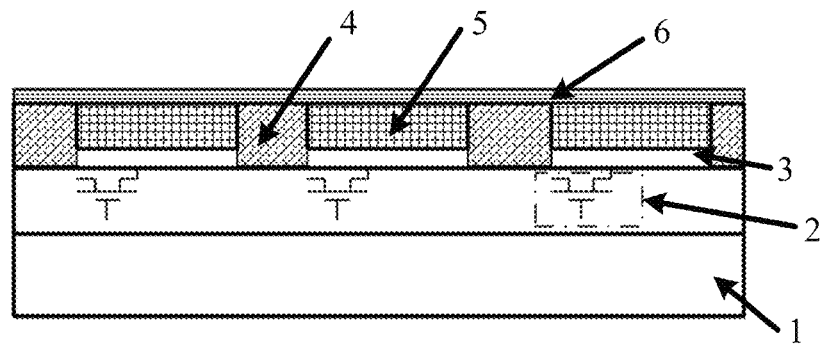
FIG. 1 is a schematic view showing a specific example of a display panel in the embodiments of the present application.
Figure 2:
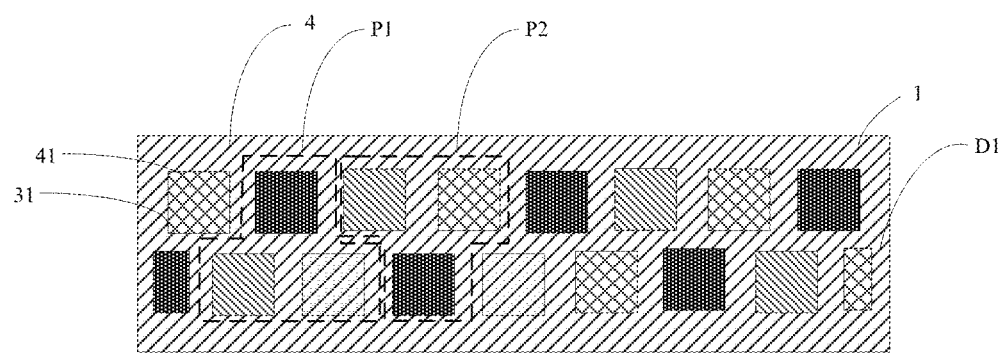
FIG. 2 is a schematic view showing an arrangement of pixels of a display panel in the embodiments of the present application.

An embodiment of the present application provides a display panel. As shown in FIG. 1 and FIG. 2, the display panel comprises: a substrate 1 and pixel circuits 2 provided on the substrate 1; a first electrode layer provided on the pixel circuits 2, wherein the first electrode layer comprises a plurality of first electrodes 3, and the first electrodes 3 have a one-to-one correspondence relationship with the pixel circuits 2, the first electrode herein is an anode, and the first electrode layer is an anode layer; a pixel-defining layer 4 having a plurality of first openings 31; a light-emitting structure layer 5 disposed within the first opening 31 to form a plurality of sub-pixels, wherein sub-pixels in adjacent rows are staggered with one another and/or sub-pixels in adjacent columns are staggered with one another; the first electrode layer provided on the pixel circuits 2, wherein the first electrode layer comprises a plurality of first electrodes 3, and the pixel circuits 2 and the first electrodes 3 have a one-to-one correspondence relationship, and the sub-pixels have a one-to-one correspondence relationship with the first electrodes; a scanning line and a data line both connected to each of the pixel circuits 2, wherein the scanning line supplies a voltage to the pixel circuit 2 to control turning-on and turning-off of the pixel circuit 2, and when the pixel circuit 2 is turned on, a drive current from the data line is directly supplied to the first electrode 3 to control light-emitting of the corresponding sub-pixel, each data line is used to respectively connect sub-pixels of the same color and is spaced at a predetermined distance from other types of sub-pixels.

Optionally, a plurality of sub-pixels constitute a plurality of sub-pixel rows and a plurality of sub-pixel columns, sub-pixels in adjacent sub-pixel rows are staggered with one another and/or sub-pixels in adjacent sub-pixel columns are staggered with one another. Specifically, as shown in FIG. 2, the first area D1 has a plurality of first openings 31. A first sub-pixel 41 (of a first light-emitting layer) is formed in each of the first openings 31. In order to show the sub-pixels of different colors in FIG. 2, square frames with different filling patterns are used to represent the formed sub-pixels of different colors. The areas where the square frames with the filling patterns are located represent the areas where the sub-pixels are located. The areas having square frames with the same filling pattern are provided with sub-pixels of the same color, and the areas having square frames with different filling patterns are provided with sub-pixels of different colors.

As shown in FIG. 2, for the first area D1, three first sub-pixels 41 form a third pixel unit P1 (or P2). The three first sub-pixels 41 are different from one another, and are respectively a red sub-pixel, a green sub-pixel and a blue sub-pixel. The three first sub-pixels 41 are located in two adjacent rows respectively, such as the first row and the second row of the first area D1, and the three first sub-pixels 41 are located adjacent to one another. In addition, one of the first sub-pixels 41 is located at a middle position between the other two first sub-pixels 41, and the three first sub-pixels 41 form a "triangle" shape or an inverted "triangle" shape. By controlling light-emitting of one or more of the three first sub-pixels 41, a plurality of different colors can be displayed, and a full-color image display can be realized in the first area.

Figure 3:
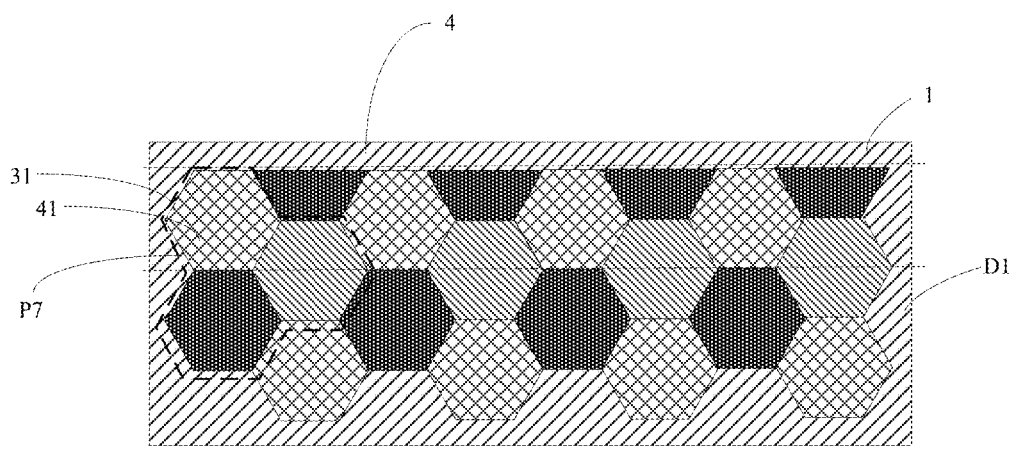
FIG. 3 is a schematic view showing another arrangement of pixels of a display panel in the embodiments of the present application.

Optionally, in some embodiments of the present application, as shown in FIG. 3, for the first area D1, three first sub-pixels 41 having different colors form a first pixel unit P7. The three first sub-pixels 41 form a first pixel unit P7 having a dodecagon shape, and the three first sub-pixels 41 are located in two adjacent rows and are adjacent to one another. In FIG. 3, the part of the first light-emitting layer between the two dotted lines in a horizontal direction can be referred to as one row, and the three first sub-pixels 41 form a first pixel unit P7 having a dodecagon shape.

In order to clearly show the structures of the display structure, the sizes of the structures of the display structure are enlarged. Therefore, some of the first sub-pixels located at an edge of the first area in FIG. 2 and FIG. 3 don't have a complete structure, but these figures are only schematic representations. In practical applications, the size of the first sub-pixel is small, and the first sub-pixels located at an edge of the first area usually have a complete structure.

Figure 4A:
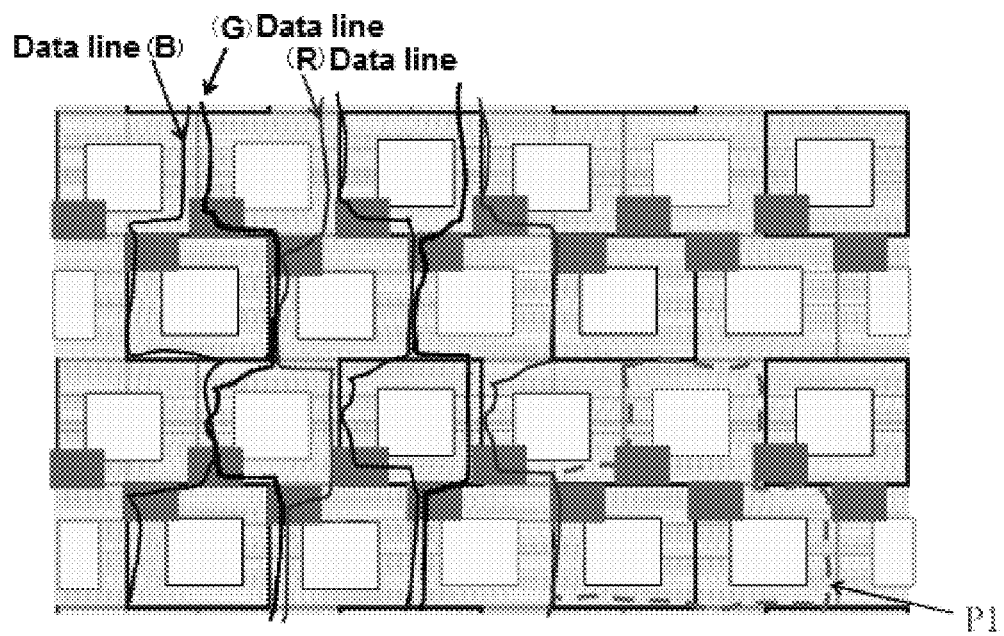
FIG. 4A and FIG. 4B are schematic views showing the structural relationship between sub-pixel electrodes and data lines in a specific example of a display panel in the embodiments of the present application.
Figure 4B:
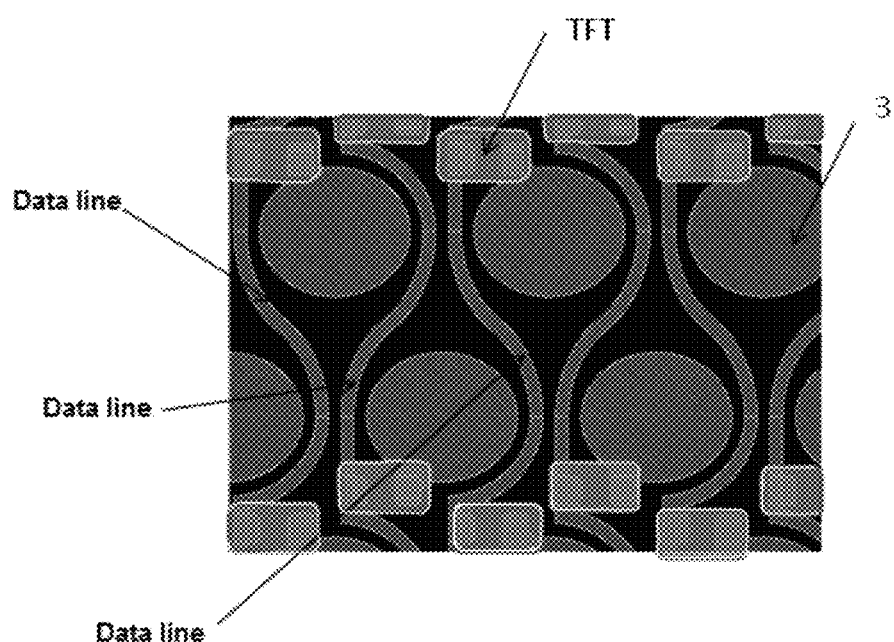

Optionally, in some embodiments of the present application, in order to adapt to the sub-pixel arrangement of the non-aligned structures, the wirings of the data lines are correspondingly designed. When the first electrode 3 of the sub-pixel is disposed on the same layer as the data line, as shown in FIGS. 4A and 4B, the data line detour between the corresponding first electrodes 3, and the data line has an extending direction not parallel to the sides of the first electrodes 3, and the data line is spaced at a predetermined distance from those first electrodes 3 not connected to it, therefore, a diffraction phenomenon of external incident light diffracting between the data line and the first electrode (preferably an anode) is prevented, thereby improving the photographing effect of the full screen, preventing mutual interference between the data line and the first electrode, and prolonging the service life of the display panel.

Figure 5:
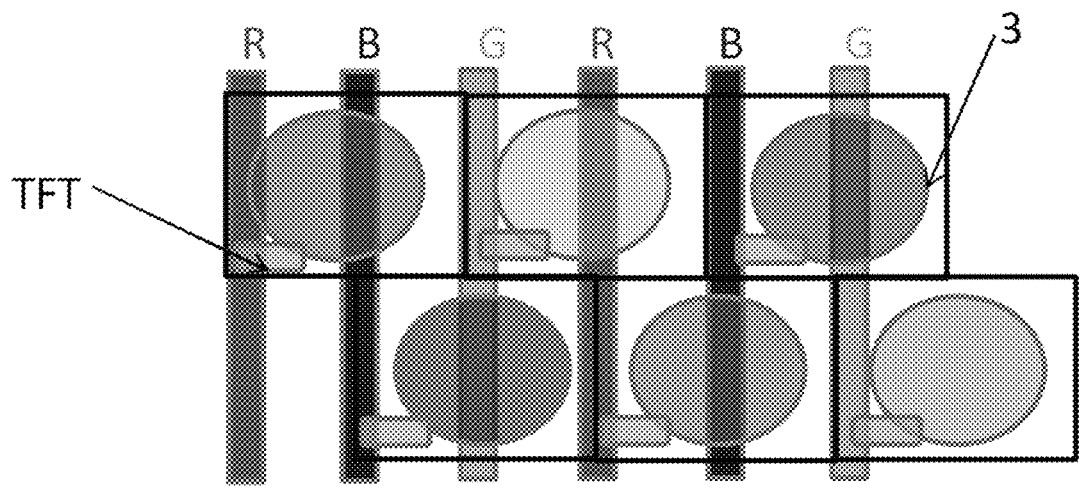
FIG. 5 is a schematic view showing the structural relationship between sub-pixel electrodes and data lines in another specific example of a display panel in the embodiments of the present application.

Optionally, in some embodiments of the present application, the data line is disposed below the first electrode 3, a projection of the data line on the substrate 1 is a first projection, and a projection of each sub-pixel of the light-emitting structure layer 5 on the substrate 1 is a second projection, each of the first projections traverses multiple ones of the second projections, and the data line is spaced at a predetermined distance from the first electrode 3 not connected to it, as shown in FIG. 5. Wherein, R/G/B respectively represent the data lines of a red sub-pixel, a green sub-pixel and a blue sub-pixel; the first electrodes 3 of sub-pixels of different colors are represented by different color depths. As can be seen from FIG. 5, the data line passes under the first electrode 3 of the sub-pixel. With such a wiring manner, the ratio of the area through which the light passes excluding the parts corresponding to the data line and TFT of each sub-pixel in relation to the entire area of each sub-pixel can be increased, that is, the aperture ratio can be increased.

Optionally, in some embodiments of the present application, the substrate 1 can be a rigid substrate or a flexible substrate. For example, the rigid substrate is made of a transparent material such as glass, quartz or plastic, and the flexible substrate is made of a material such as polyimide, polycarbonate, polyethylene terephthalate or the like to improve the transparency of the device. The flexible substrate can be suitable for making a flexible display panel.

Optionally, in some embodiments of the present application, a second electrode 6 is disposed on the light-emitting structure layer 5, and the second electrode 6 is a cathode which is a surface electrode, that is, an overall surface electrode made of a whole surface of electrode material. A scanning line and a data line are both connected to each of the pixel circuits 2, and the scanning line controls the turning-on and turning-off of the pixel circuit 2. When the pixel circuit 2 is turned on, the data line provides a drive current for the first electrode 3 to control light-emitting of the sub-pixel.

In the above display panel, the scanning line supplies voltage for the pixel circuit to control the turning-on and turning-off of the pixel circuit, which requires only a switching voltage needed by the pixel circuit to be supplied, thereby greatly reducing the load current of the scanning line. When the pixel circuit is turned on, a drive current from the data line is directly supplied to the first electrode to control light-emitting of the sub-pixel, the data line only needs to supply the drive current for one sub-pixel at each time, so that the data line also has a very small load. A plurality of sub-pixels share the surface electrode (cathode) and the currents of one row of sub-pixels are supplied by the overall surface cathode at each time, so that the conductivity requirements for the cathode are greatly reduced, and electrodes with high transparency can be used to increase transparency and improve the overall consistency of the screen.

Optionally, the light emitting structure layer may be a light emitting structure layer situated between the anode and the cathode in an Organic Light-Emitting Diode (OLED).

Figure 6:
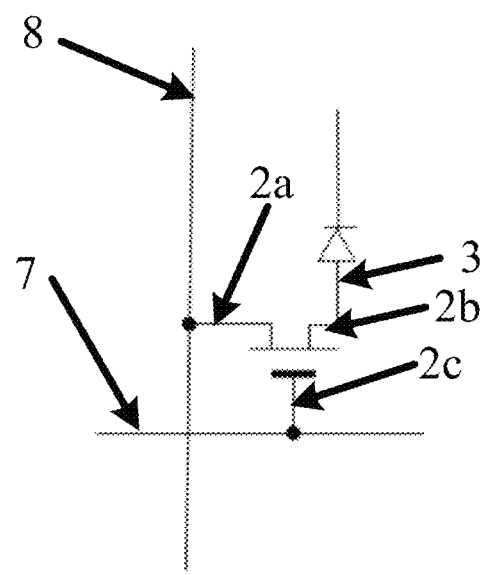
FIG. 6 is a schematic view showing a pixel circuit of a display panel in the embodiments of the present application.

Optionally, as shown in FIG. 6, unlike the conventional AMOLED pixel circuit, the pixel circuit 2 comprises only a switching device and does not comprise elements such as a storage capacitor. Specifically, the pixel circuit 2 only comprises one switching device, and the switching device comprises a first terminal 2a, a second terminal 2b and a control terminal 2c, as described in detail below. A scanning line 7 is connected to the control terminal 2c of the switching device, a data line 8 is connected to the first terminal 2a of the switching device, and a first electrode 3 is connected to the second terminal 2b of the switching device. As shown in FIG. 6, each pixel circuit 2 comprises one switching device, and the respective switching devices have a one-to-one correspondence relationship with the respective first electrodes 3, a data line 8 is connected to the first terminal 2a of each switching device, a scanning line 7 is connected to the control terminal 2c of each switching device, and a plurality of sub-pixels have a one-to-one correspondence relationship with a plurality of switching devices, that is, one sub-pixel corresponds to one switching device. The data line is connected to the first terminal of the switching device, and the scanning line is connected to the control terminal of the switching device, and the number of the switching device(s) in the pixel circuit is reduced to one. During the working process, only a switching voltage of the TFT needs to be input into the scanning line, and the load current of the OLED is not required to be input into the scanning line, thereby greatly reducing the load current of the scanning line, such that the scanning line in the present application can be made of a transparent material such as ITO. Meanwhile, the data line only needs to supply the current for one OLED pixel at each time, so the current load of the data line is also relatively small. Therefore, the data line can also be made of a transparent material such as ITO, thereby improving the light transmittance of the display screen.

Optionally, in an alternative embodiment, when the pixel circuit comprises one switching device, the switching device is a driving TFT, the first terminal 2a is a source electrode 21 of the driving TFT, the second terminal 2b is a drain electrode 22 of the driving TFT, and the control terminal 2c is a gate electrode 23 of the driving TFT; the driving TFT has a top gate structure or a bottom gate structure. In the actual manufacturing process, the source electrode 21 and the drain electrode 22 of the TFT have the same structure and can be exchanged. In this example, for convenience of description, a source electrode of the thin film transistor can be named as the first terminal and a drain electrode of the thin film transistor can be named as the second terminal. Certainly, in other examples, a drain electrode of the thin film transistor can be named as the first terminal, and a source electrode of the thin film transistor can be named as the second terminal. In another alternative example, the switching device can also be a Metal-Oxide-Semiconductor Field-Effect Transistor (MOSFET) and may also be other elements that conventionally have switching characteristics, such as insulated gate bipolar transistor (IGBT), etc., any electronic element capable of realizing the switching function in the present example and being integrated into the display panel falls within the protection scope of the present application.

Optionally, the thin film transistor may be an oxide thin film transistor or a low temperature polycrystalline silicon thin film transistor (LTPS TFT). Preferably, the thin film transistor is an indium gallium zinc oxide thin film transistor (IGZO TFT). The low temperature polycrystalline silicon thin film transistor has the advantages of high electron mobility, high resolution, simple design and better display effect; the oxide thin film transistor has the advantages of high light transmittance, mature processing and simple manufacturing.

Figure 7:
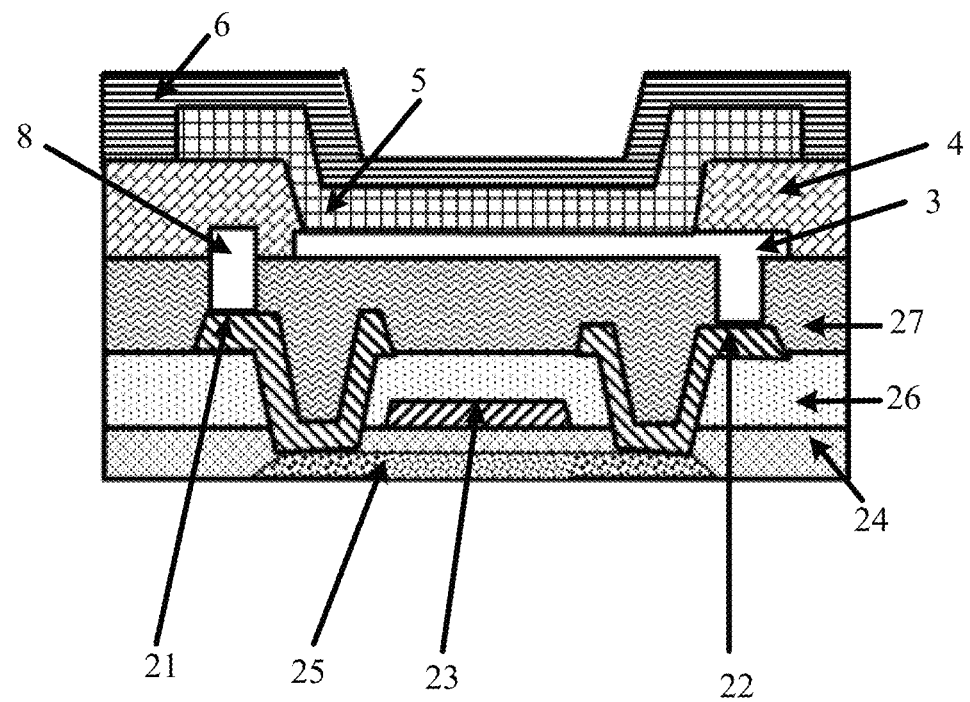
FIG. 7 is a schematic view showing another specific example of a display panel in the embodiments of the present application, in which the thin film transistor of which is configured as a top gate structure.

Optionally, when the thin film transistor is configured as a top gate structure, as shown in FIG. 7, the thin film transistor comprises an active layer 25; a gate insulating layer 24 disposed on the active layer 25; a gate electrode 23 disposed on the gate insulating layer 24 and connected to the scanning line; an interlayer insulating layer 26 disposed on the gate electrode 23; a source electrode 21 and a drain electrode 22 disposed on the interlayer insulating layer 26. The above-mentioned active layer, gate insulating layer, gate electrode layer, interlayer insulating layer, source electrode and drain electrode constitute a switching device TFT. A planarization layer 27 is arranged on the source electrode 21 and the drain electrode 22, and the source electrode 21 and the drain electrode 22 are respectively connected to the data line 8 and the first electrode 3 via through-holes in the planarization layer 27. The number of photolithographic masks required for the TFT of the top gate structure is small, the manufacturing process is simple, and the cost is low.

Figure 8:
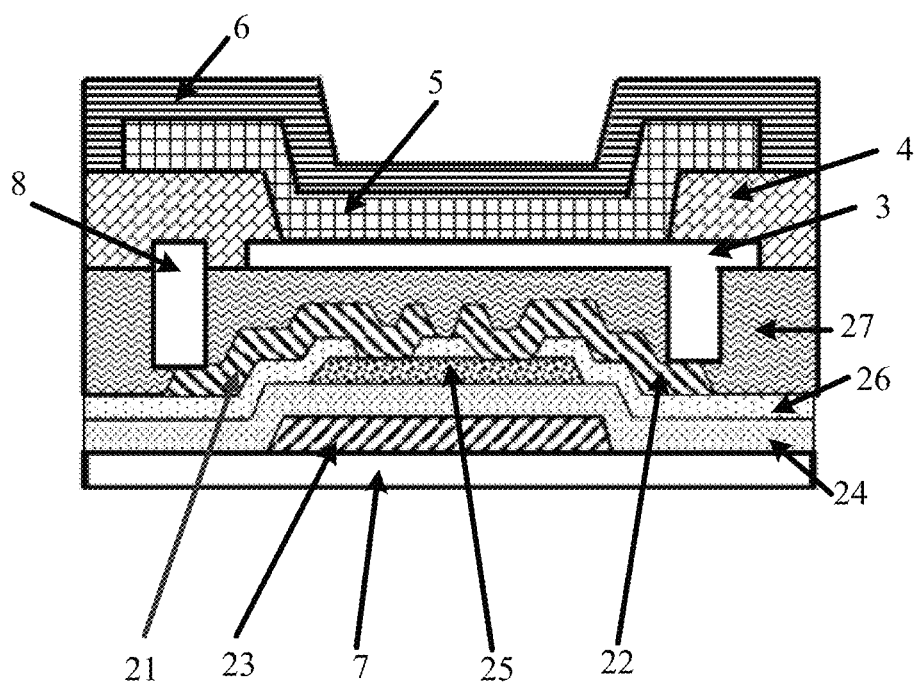
FIG. 8 is a schematic view of another specific example of a display panel in the embodiments of the present application, in which the thin film transistor of which is configured as a bottom gate structure.

In an alternative embodiment, when the thin film transistor is configured as a bottom gate structure, as shown in FIG. 8, the thin film transistor comprises a gate electrode 23 disposed on a scanning line 7 and connected to the scanning line 7; a gate insulating layer 24, an active layer 25 and an interlayer insulating layer 26 which are sequentially stacked on the gate electrode 23; a source electrode 21 and a drain electrode 22 which are disposed on the interlayer insulating layer 26; and a planarization layer 27 disposed on the source electrode 21 and the drain electrode 22. The source electrode 21 and the drain electrode 22 are respectively connected to the data line 8 and the first electrode 3 via through-holes in the planarization layer 27. The manufacturing process of the bottom gate structure is complicated, but the gate electrode and the gate insulating layer of the TFT can be used as optical protective films, so the optical characteristics thereof is good.

Figure 15:
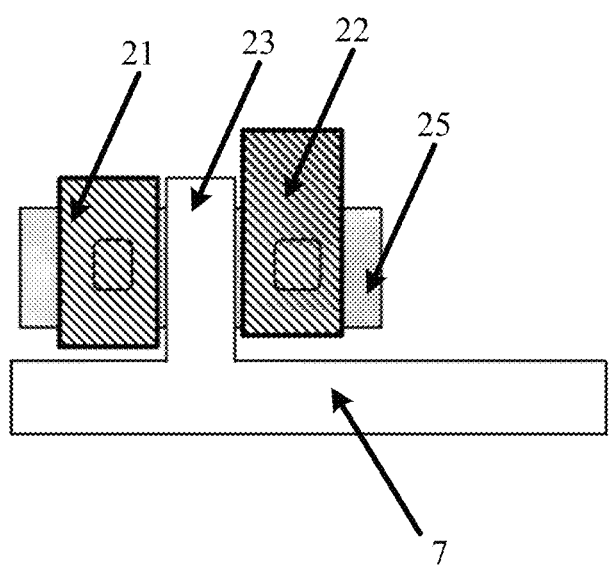
FIG. 15 is a structural schematic view showing another specific example of the switching device in the embodiments of the present application.

Optionally, the gate electrode can be made of a transparent conductive material or a metal material. The scanning line is connected to the gate electrode. When the gate electrode is made of a transparent conductive material, in order to simplify the processing steps and save the technical processes, the scanning line and the gate electrode are formed in the same processing step. In an optional embodiment of the present application, specifically, the scanning line and the gate electrode can be made of ITO material, and in the manufacturing process, an ITO layer may be manufactured firstly, and then the ITO layer can be patterned by a first mask to simultaneously form the scanning line and the gate electrode, as shown in FIG. 15.

Figure 14:
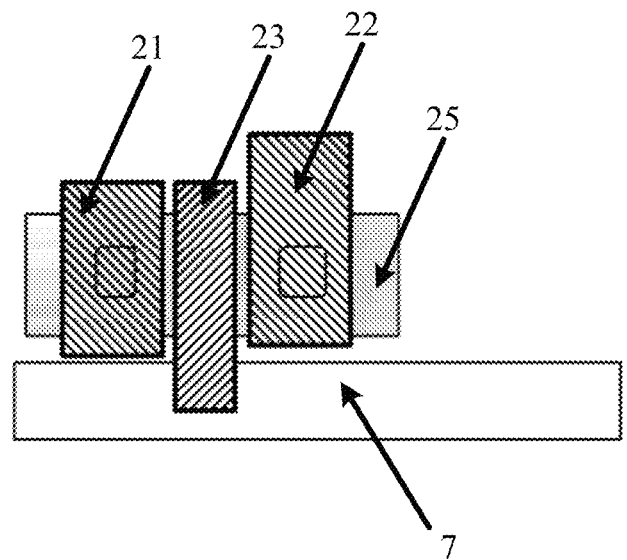
FIG. 14 is a structural schematic view showing a specific example of a switching device in the embodiments of the present application.

In an alternative embodiment, when the gate electrode is made of metal, the scanning line can be disposed above or below the gate electrode, and the gate electrode and the scanning line need to be formed separately, as shown in FIG. 14.

In order to simplify the processing steps and save technical processes, the data line and the first electrode can be formed in the same processing step. In an optional embodiment, the data line and the first electrode are both made of ITO material, wherein an overall surface of ITO is manufactured, and the ITO layer can be patterned by a second mask to simultaneously form the data line and the first electrode. In an alternative embodiment, when the data line and the first electrode are made of different materials, the data line and the first electrode may also be formed separately.

In an optional embodiment of the present application, in order to maximize the overall transparency of the display panel, all of the first electrode, the second electrode, the data line and the scanning line are made of a transparent conductive material with a light transmittance of greater than 90%, such that the entire display panel has a light transmittance of greater than 70%, and the display panel has a higher transparency.

Specifically, the transparent conductive materials used in the above-mentioned first electrode, second electrode, data line, and scanning line can be indium tin oxide (ITO), indium zinc oxide (IZO), or silver-doped indium tin oxide (Ag+ITO), or silver-doped indium zinc oxide (Ag+IZO). Since the ITO has mature processing technique and low cost, preferably the conductive material is indium zinc oxide. Furthermore, in order to reduce electrical resistance of each conductive wiring on the basis of ensuring high light transmittance, the transparent conductive material can be aluminum-doped zinc oxide, silver-doped ITO or silver-doped IZO.

In other alternative embodiments, the transparent conductive material may be other conventional materials, which may be appropriately chosen according to actual needs, which is not limited herein. In an alternative embodiment of the present application, at least one of the first electrode, the second electrode, the data line and the scanning line can be made of a transparent conductive material.

A plurality of scanning lines extend along a first direction, a plurality of data lines extend along a second direction, the first direction intersects with the second direction. In an optional embodiment of the present application, the scanning lines extend in the X direction, the data lines extend in the Y direction, and the projections of the data lines and the scanning lines on the substrate are perpendicular to each other, both sides of each scanning line in the extending direction thereof have a wave shape, and both sides of each data line in the extending direction thereof also have a wave shape. The data lines and the scanning lines that have wave shapes can generate diffraction fringes having different positions and diffusion directions, thereby weakening the diffraction effect, so that, when a camera is disposed below the display panel, the image acquired by the camera has a higher definition.

Figure 9:
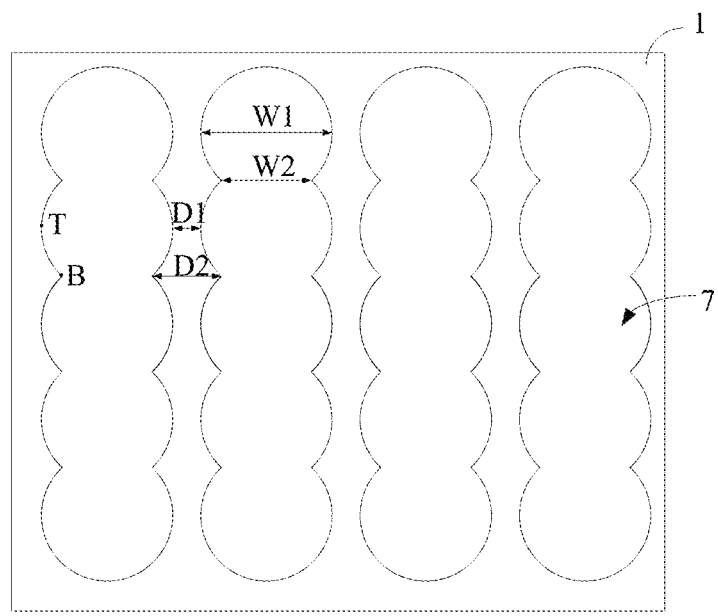
FIG. 9 is a schematic view showing a specific example of scanning lines of a display panel in the embodiments of the present application.

As the scanning lines have a wave shape, adjacent scanning lines have a first distance therebetween, and the first distance changes continuously or intermittently; and a width of each scanning line changes continuously or intermittently. Changing continuously in width means that any two adjacent positions on the scanning line have different widths. In FIG. 9, the extending direction of the scanning line is its longitudinal direction. The scanning lines continuously change in width in the extending direction thereof. Changing intermittently in width means that there are certain segments on the scanning line where two adjacent positions have the same width, and there are other segments on the scanning line where two adjacent positions have different widths. In an embodiment of the present application, a plurality of scanning lines are regularly arranged on the substrate, and therefore, the distance between two adjacent scanning lines also exhibits continuous change or intermittent change in a direction parallel to the extending direction of the scanning lines. The scanning lines can change periodically in width in the extending direction thereof regardless of whether the width thereof is changing continuously or changing intermittently.

Figure 10:
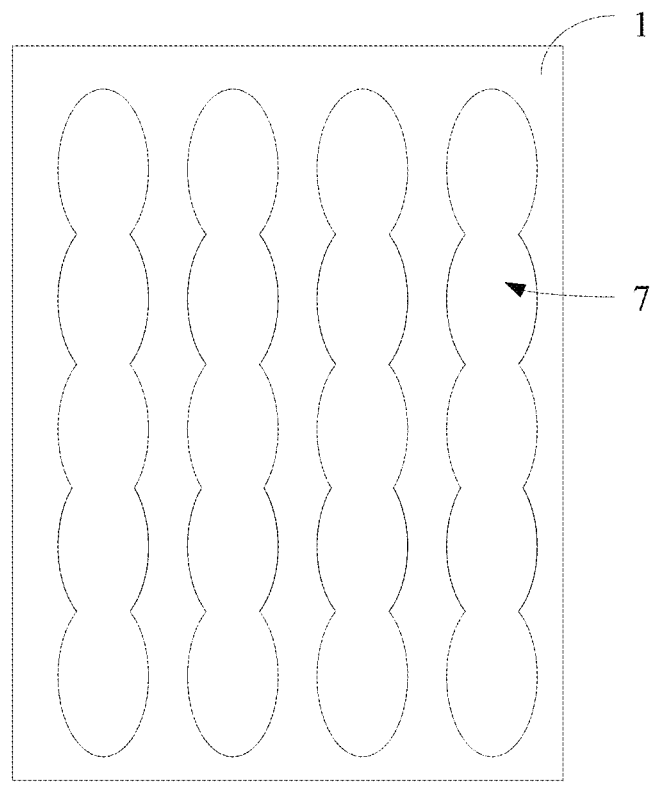
FIG. 10 is a schematic view showing another specific example of scanning lines of a display panel in the embodiments of the present application, with shapes different from the scanning lines of FIG. 9.

Both sides of the scanning line in the extending direction thereof have a wave shape, and wave crests of the two sides are oppositely disposed, and wave troughs thereof are oppositely disposed. As shown in FIG. 9, the wave crests T of the two sides in the extending direction are oppositely disposed and the wave troughs B thereof are oppositely disposed. The width between the wave crests of the same scanning line is W1, and the width between the wave troughs of the same scanning line is W2. The distance between the wave crests of two adjacent scanning lines is D1, and the distance between the wave troughs of two adjacent scanning lines is D2. In an embodiment of the present application, both sides thereof are connectable by the same circular arc. In other embodiments, the two sides thereof may also be connectable by the same elliptical line, as shown in FIG. 10. By setting the two sides of each scanning line into a wave shape connectable by a circular arc shape or an elliptical shape, it can be ensured that the diffraction fringes generated by the scanning lines can be spread in different directions, so that a more notable diffraction effect is not generated.

Optionally, a first connecting portion is formed at a position where the wave troughs of the wave shaped sides of the scanning line are oppositely disposed, and the first connecting portion may be rectilinear or curvilinear. As shown in FIG. 11, the first connecting portion is strip-shaped, and the first connecting portion is an area electrically connecting the scanning line to the switching device, that is, a position where the control terminal of the switching device is connected to the first connecting portion. In other embodiments, the connecting portion may also have other irregular structures, such as a shape which is large at both ends and small in the middle, or a shape which is small at both ends and large in the middle.

Optionally, as the data lines have a wave shape, adjacent data lines have a second distance therebetween, and the second distance changes continuously or intermittently; and a width of each data lines changes continuously or intermittently. The data line is similar to the scanning line, referring to the detailed description of the data line, and the details thereof are not repeatedly described herein. The data line can have any of the wave shapes in FIGS. 9-11. The two sides of each data line in the extending direction thereof have a wave shape, and wave crests of the two sides are oppositely disposed, and wave troughs thereof are oppositely disposed. A second connecting portion is formed at a position where the wave troughs of the data line are oppositely disposed, and the second connecting portion is an area electrically connecting the data line to the switching device. The setting of the data line is similar to that of the scanning line, and the details thereof can be refer to the setting of the scanning lines.

The scanning lines and data lines on the display panel have any one of the wave shapes as shown in FIG. 9-11 to ensure that incident light can form diffraction fringes having different positions when passing through the locations with different widths and different distances between adjacent wirings in the extending direction of the data lines and the scanning lines, thereby diminishing the diffraction effect, so that the photosensitive device arranged below the display panel can work normally.

The scanning line of the above display panel is connected to the control terminal of the switching device, and the scanning line only needs to supply the switching voltage to the switching device, and does not need to supply a drive current flowing through the light emitting device, which greatly reduces the load current of the scanning line. The data line is connected to the first terminal of the switching device, and the data line only needs to supply the drive current to one sub-pixel at each moment, so the load on the data line is also small. Since the loads on the data line and the scanning line are both very small, the data line and the scanning line can be made of a transparent material (such as ITO) which significantly improves the transparency of the display panel. The cathode has an overall surface structure, and no negative photoresist is required to divide the cathode, the current of one row of the OLEDs is supplied by the overall surface cathode at each moment, so the conductivity requirement for the cathode is greatly reduced, therefore a cathode with better transparency can be used to improve the transparency. The contradiction between wiring of a transparent OLED screen as well as the cathode resistance thereof on one hand and the transparency thereof on the other hand is well solved by the above technical solution, and the technical processing thereof can be compatible with the manufacturing process of conventional display screens.

The display panel provided in the embodiments of the present application has a full-screen design, and on the display panel above the camera, the pixel circuits and the sub-pixels have a one-to-one correspondence relationship for driving, such that the number of transistors for driving the Organic Light-Emitting Diodes (OLEDs) is reduced and the transparency of the display screen is increased. In addition, considering the sub-pixel arrangement in the display screen is not aligned in rows or columns, a special wiring design is provided, such that, at the same time of achieving a high transparency of the display panel, a diffraction phenomenon of external incident light diffracting between the data line and the first electrode (preferably an anode) is prevented, thereby improving the photographing effect of the full screen, preventing mutual interference between the data line and the first electrode, and prolonging the service life of the display panel.

The embodiments of the present application further provide a method for manufacturing a display panel. As shown in FIG. 12, the method comprises the following steps:

Step S1: switching devices, scanning lines and data lines are formed; each of the switching devices comprises a first terminal, a second terminal and a control terminal, respectively, the data line is connected to the first terminal of the switching device, and the scanning line is connected to the control terminal of the switching device.

Figure 13:
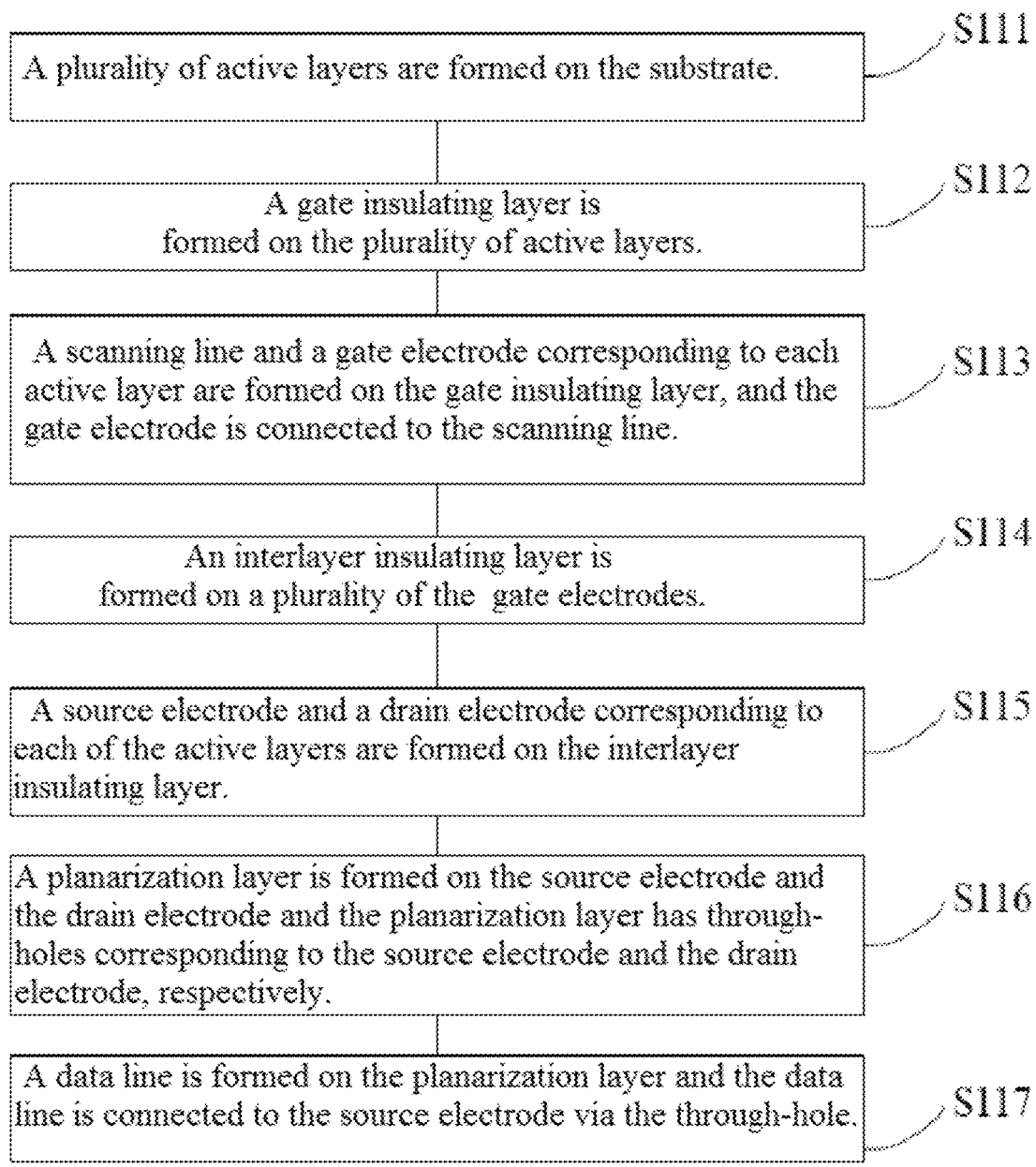
FIG. 13 is a flow chart showing a specific example of forming switching devices, scanning lines and data lines on a substrate in a method for forming a display panel in the embodiments of the present application.

Optionally, when the switching device is a top gate thin film transistor, as shown in FIG. 13, the step S1 specifically comprises the following steps S111-S117:

Step S111: a plurality of active layers 25 are formed on the substrate 1.

Optionally, the substrate 1 may be a rigid substrate, such as a transparent substrate selected from a glass substrate, a quartz substrate or a plastic substrate; the substrate 1 may also be a flexible substrate such as a polyimide (PI) film or the like.

Optionally, a polycrystalline silicon (P—Si) layer is formed on the substrate, and the P—Si layer comprises a shielding layer 28 and an active layer 25 which are sequentially stacked due to the processing technique employed. The shielding layer is used to isolate oxygen, water and the like, and at the same time, it forms a good interface with the active layer. Specifically, an entire surface of P—Si layer is formed on the substrate, and then a photoresist is coated on the entire surface of P—Si layer, and exposure is carried out by using an active layer mask (PSI mask) to form a patterned active layer 25.

Optionally, the active layer may be made of a polysilicon material to form a polysilicon thin film transistor; and the polycrystalline silicon may be crystallized to produce a crystalline thin film transistor. In an alternative embodiment, the active layer may also be made of amorphous silicon, which can be appropriately chosen as needed.

Step S112: a gate insulating layer 24 is formed on the plurality of active layers 25. Optionally, the gate insulating layer can be manufactured by a chemical vapor deposition method. The gate insulating layer can be manufactured by other conventional methods, which is not limited herein. The gate insulating layer may be made of silicon oxide or silicon nitride, which may be appropriately chosen as needed.

Step S113: a scanning line 7 and a gate electrode 23 corresponding to each active layer 25 are formed on the gate insulating layer 24, wherein the gate electrode 23 is connected to the scanning line 7. Optionally, the scanning line 7 is made of indium tin oxide (ITO) material, and the gate electrode 23 is made of a metal material, specifically, an overall surface ITO layer is formed on the gate insulating layer 24, and then a patterned scanning line 7 is formed by using a mask, after which a metal gate electrode is formed on the gate insulating layer, and the gate electrode is located on the same layer as the scanning line and is connected to the scanning line, as shown in FIG. 14. In an alternative embodiment, the scanning line 7 is made of an indium zinc oxide (IZO) material, and may be made of other conventional transparent conductive materials. The order of the step for forming the gate electrode and the step for forming the scanning line can be adjusted according to the technical process, which is not limited herein.

In another alternative example, the scanning line 7 and the gate electrode 23 are both made of indium tin oxide (ITO) material, specifically, an overall surface ITO layer is formed on the gate insulating layer 24, and then a mask is used to simultaneously form the patterned scanning line 7 and the gate electrode 23. The gate electrode is located in the same layer as the scanning line and connected to the scanning line, and the manufacturing process is simpler and is easier to be performed, as shown in FIG. 15.

In order to reduce the diffraction, the shape of the scanning line may refer to the description of the display panel in the above embodiments of the present application, and the details thereof are not repeatedly described herein.

Step S114: an interlayer insulating layer 26 is formed on a plurality of the gate electrodes 23. Optionally, the interlayer insulating layer can be formed by a chemical vapor deposition method. The interlayer insulating layer can be formed by other conventional methods, which is not limited herein. The interlayer insulating layer may be made of silicon oxide or silicon nitride, which may be appropriately chosen as needed.

Step S115: a source electrode 21 and a drain electrode 22 corresponding to each of the active layers 25 are formed on the interlayer insulating layer 26. The source electrode 21 and the drain electrode 22 described above may be manufactured in any conventional manner. In order to ensure the performance of the TFT, the source electrode 21 and the drain electrode 22 are made of metal material, such as a single layer of metal material or stacked metal layers with good conductivity such as Ti, Ti/Al/Ti, or Ag.

Step S116: a planarization layer 27 is formed on the source electrode 21 and the drain electrode 22. The planarization layer 27 has through-holes corresponding to the source electrode 21 and the drain electrode 22, respectively. The corresponding source electrode 21 and drain electrode 22 are exposed at the through-holes. The above planarization layer can be manufactured in any conventional manner. Optionally, the through-holes may be formed in the planarization layer by a wet etching process, or by other conventional methods, such as dry etching.

Step S117: a data line 8 is formed on the planarization layer 27. The data line 8 is connected to the source electrode 21 via the through-hole. The above data line 8 can be manufactured in any conventional manner. The data line 8 is made of indium tin oxide (ITO) material, and may also be made of indium zinc oxide (IZO) material, and may be made of other conventional transparent conductive materials. In order to reduce the diffraction, the shape of the data line can refer to the description of the display panel in the above embodiments of the present application, and the details thereof are not repeatedly described herein.

Figure 16:
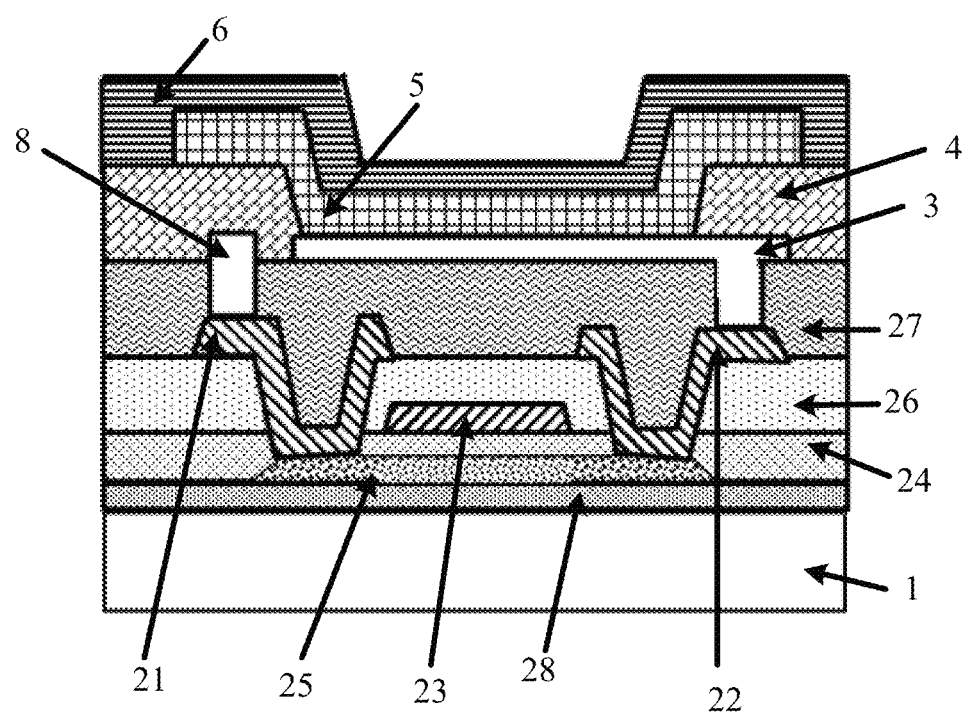
FIG. 16 is a structural view of a specific example of a display panel formed by a method for forming a display panel in the embodiments of the present application.

A structural view of the display panel manufactured by the above steps is shown in FIG. 16.

Figure 17:
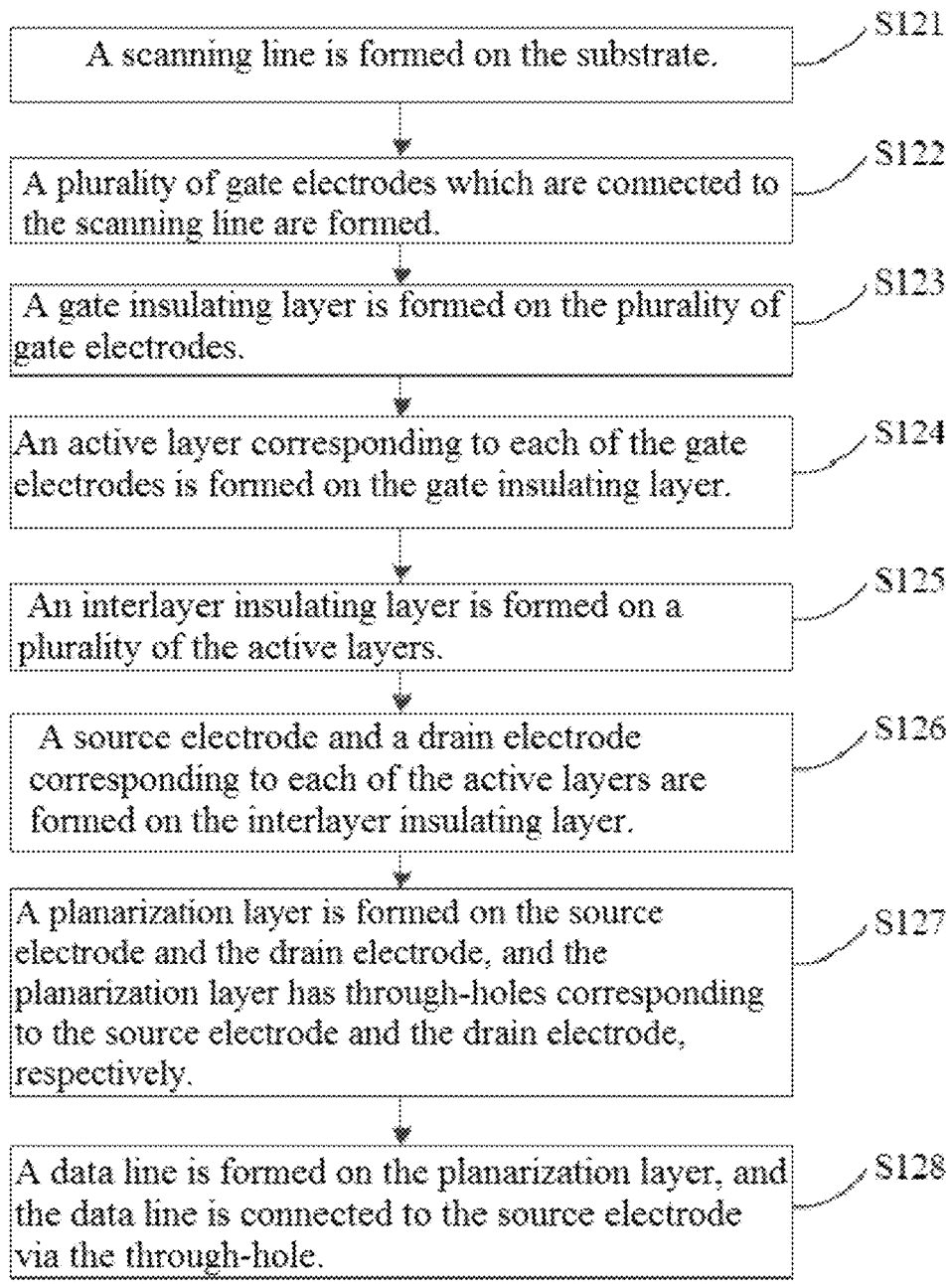
FIG. 17 is a flow chart showing another specific example of forming switching devices, scanning lines, and data lines on a substrate in the method for forming a display panel in the embodiments of the present application.

In an alternative embodiment, when the switching device is a bottom gate thin film transistor, as shown in FIG. 17, the step S1 specifically comprises the following steps S121-S128:

Step S121: a scanning line 7 is formed on the substrate 1. Optionally, the scanning line 7 is made of indium tin oxide (ITO) material, specifically, an overall surface ITO layer is formed on the substrate, and then a patterned scanning line 7 is formed by using a mask.

Optionally, the substrate 1 may be a rigid substrate, such as a transparent substrate selected from a glass substrate, a quartz substrate or a plastic substrate; the substrate 1 may also be a flexible substrate such as a PI film or the like.

Step S122: a plurality of gate electrodes 23 which are connected to the scanning line 7 are formed. The above gate electrodes can be manufactured in any conventional manner.

Step S123: a gate insulating layer 24 is formed on the plurality of gate electrodes 23. Optionally, the gate insulating layer can be formed by a chemical vapor deposition method. The gate insulating layer can be formed by other conventional methods, which is not limited herein. The gate insulating layer may be made of silicon oxide or silicon nitride, which may be appropriately chosen as needed.

Step S124: an active layer 25 corresponding to each of the gate electrodes 23 is formed on the gate insulating layer 24. The above active layer 25 can be manufactured in any conventional manner. Optionally, the active layer can be made of an oxide material, such as an indium gallium zinc oxide (IGZO) material.

Step S125: an interlayer insulating layer 26 is formed on a plurality of the active layers 25. Optionally, the interlayer insulating layer can be manufactured by a chemical vapor deposition method. Certainly, the interlayer insulating layer can be formed by other conventional methods, which is not limited herein. The interlayer insulating layer may be made of silicon oxide or silicon nitride, which may be appropriately chosen as needed.

Step S126: a source electrode 21 and a drain electrode 22 corresponding to each of the active layers 25 are formed on the interlayer insulating layer 26. The source electrode 21 and the drain electrode 22 described above may be manufactured in any conventional manner.

Step S127: a planarization layer 27 is formed on the source electrode 21 and the drain electrode 22, and the planarization layer 27 has through-holes corresponding to the source electrode 21 and the drain electrode 22, respectively, and the corresponding source electrode 21 and drain electrode 22 are exposed at the through-holes. Optionally, the details thereof may refer to the step S116.

Step S128: a data line 8 is formed on the planarization layer 27, and the data line 8 is connected to the source electrode 21 via the through-hole. The above data line 8 can be manufactured in any conventional manner. The data line 8 is made of indium tin oxide (ITO) material.

The structural view of the display panel manufactured by the above steps is as shown in FIG. 18.

Step S2: a first electrode 3, a pixel-defining layer 4, a light emitting structure layer 5 and a second electrode 6 are correspondingly formed on each of the plurality of switching devices, the plurality of light emitting structure layers 5 share the second electrode 6, and the first electrodes 3 corresponding to the plurality of light emitting structure layers 5 are respectively connected to the second terminals 2b of the respective switching devices.

Optionally, as shown in FIG. 19, the step S2 specifically comprises the following steps S21-S24:

Step S21: a corresponding first electrode 3 is formed on the drain electrode 22 of the thin film transistor, and the first electrode 3 is connected to the drain electrode 22. Optionally, specifically, the first electrode 3 is formed on the planarization layer 27, and the first electrode 3 is made of ITO material, and after the ITO material is filled into the through-hole, the ITO material becomes connected to the drain electrode 22. In an alternative embodiment, the data line and the first electrode are located in the same layer and can be manufactured simultaneously by covering an overall surface of ITO material on the planarization layer 27 and then forming the patterned data line and the first electrode by using a mask. The manufacturing process is simple and cost-effective. In order to reduce the diffraction, the shape of the first electrodes can refer to the description of the display panel in the above embodiments of the present application, and details thereof are not repeatedly described herein.

Step S22: a pixel-defining layer 4 is formed on the first electrodes 3. The pixel-defining layer 4 comprises a plurality of openings, each of the openings corresponds to a first electrode, and the first electrode is exposed at the opening. Optionally, the sides of a projection of the opening formed in the pixel-defining layer 4 projected on the substrate are not parallel to each other and the respective sides are curved, that is, the opening has varying widths in every direction and thus has different diffraction spreading directions at the same location. When external incident light passes through the opening, diffraction fringes having different positions and diffusion directions can be generated at the locations with different widths, so that a notable diffraction effect is not generated, thereby ensuring the photosensitive element disposed below the display panel can work normally. In order to reduce the diffraction, the shape of the projection of the opening can refer to the description of the display panel in the above embodiments of the present application, and details thereof are not repeatedly described herein.

Step S23: a light-emitting structure layer 5 having a one-to-one correspondence relationship with the first electrode 3 is formed on the pixel-defining layer 4. Optionally, specifically, the light-emitting structure layer 5 is formed in the opening, and the light-emitting structure layer 5 can be manufactured in any conventional manner.

Step S24: a second electrode 6 is formed on the light-emitting structure layer 5, and the plurality of light-emitting structure layers 5 share the common second electrode 6. Optionally, specifically, an overall surface of the second electrode 6 is formed on the plurality of light emitting structure layers 5 and the pixel-defining layer 4. Optionally, the second electrode 6 can be made of ITO material.

The embodiments of the present application further provide a display screen which comprises at least a first display area and a second display area, each display area is used for displaying a dynamic or static image, and a photosensitive device is disposed below the first display area; and the first display area is provided with the display panel of any of the above embodiments, and the second display area is provided with a PMOLED display panel or an AMOLED display panel. Since the display panel according to any of the above embodiments is used in the first display area, the first display area has better transparency and the overall consistency of the display screen is better, and when incident light passes through this display area, a notable diffraction effect is prevented, thereby ensuring that the photosensitive device arranged below the first display area can work normally. The first display area can normally display dynamic or static images when the photosensitive device is not working, and the first display area is in a non-displaying state when the photosensitive device is working, thereby ensuring that light collection by the photosensitive device can be performed normally through the display panel. The transparency of the first display area is significantly improved, so that contradiction between the wiring of a transparent OLED screen and the cathode resistance thereof on one hand and the transparency thereof on the other hand is well solved, and this design can be compatible with the manufacturing process of a normal display screen, and the production cost is low.

Figure 20A:
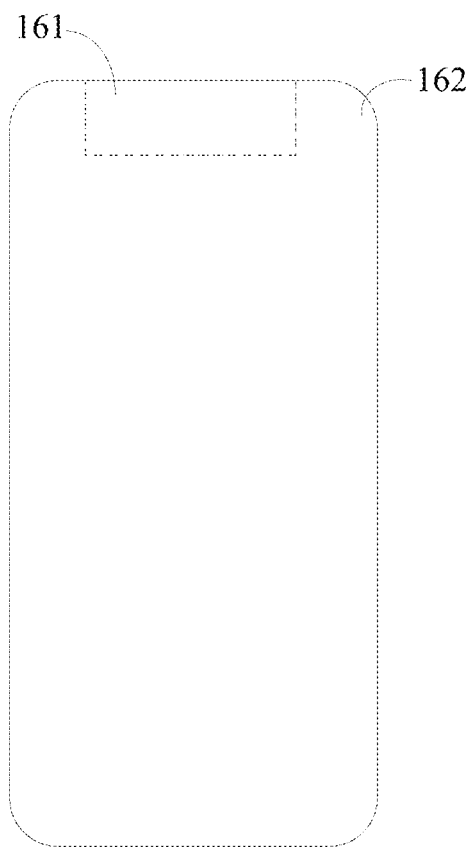
FIG. 20A to FIG. 20C are schematic views showing a specific example of a display screen in the embodiments of the present application.

Optionally, as shown in FIG. 20A, the display screen comprises a first display area 161 and a second display area 162, each of which is used to display a static or dynamic image, and the display panel mentioned in any of the above embodiments is used in the first display area 161, and the first display area 161 is located at the upper portion of the display screen.

Figure 20B:
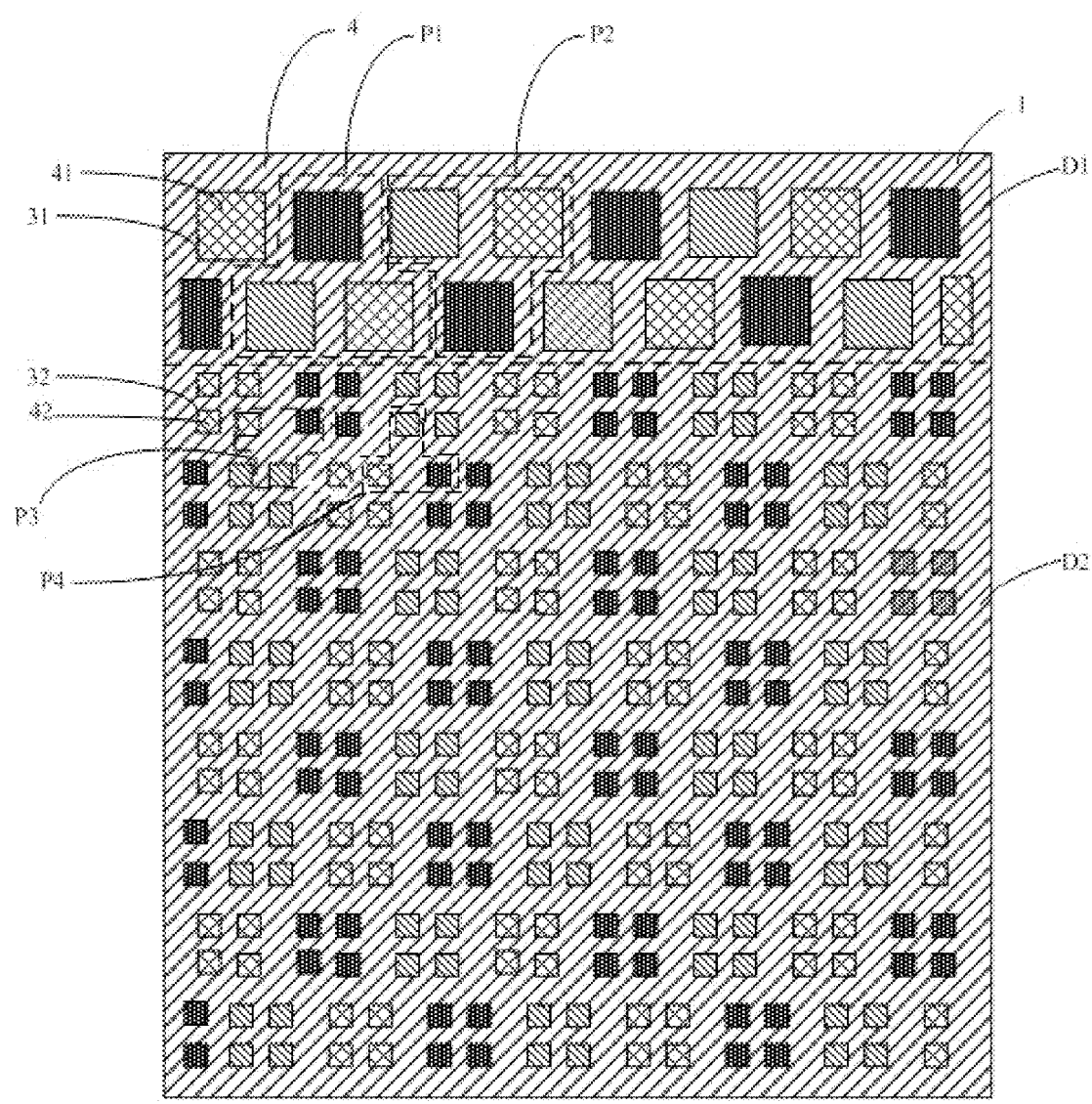

Optionally, in some embodiments of the present application, as shown in FIG. 20B, the display screen comprises a first area D1 and a second area D2, and the second area D2 has an area size larger than that of the first area D1, and the first area D1 has a resolution lower than that of the second area D2; a plurality of first openings 31 are defined in the first area D1, a plurality of second openings 32 are defined in the second area D2, and each of the first openings 31 has an area larger than that of each of the second openings 32.

Figure 21:
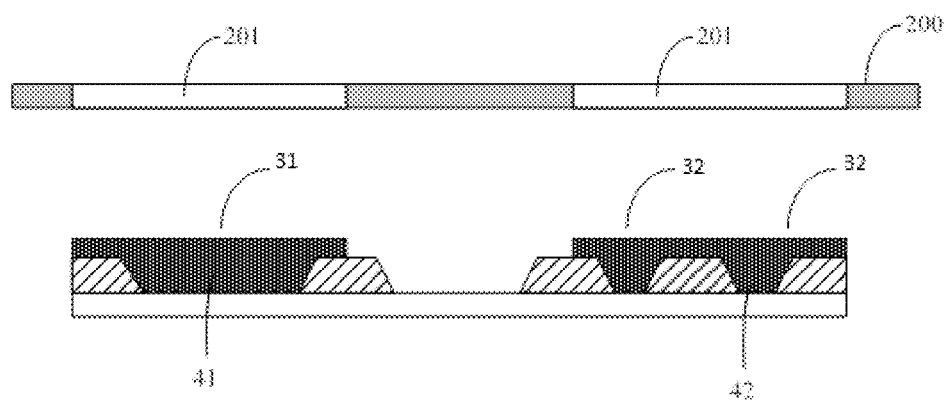
FIG. 21 is a schematic view showing a first light emitting layer and a second light emitting layer formed on a substrate using a fine mask in a display panel in the embodiments of the present application.

As shown in FIG. 21, a first light-emitting layer 41 and a second light-emitting layer 42 can be formed by vapor deposition using the same fine mask 200. In order to ensure the accuracy of vapor deposition and prevent deformation caused by uneven force during the process of applying the fine mask, a fine mask 200 with openings 201 all having the same area size and shape can be used.

The fine mask 200 is aligned with the substrate 10, and each of the openings 201 of the fine mask 200 corresponds to an area where the light emitting layer of a required color is located. For example, as shown in FIG. 21, one opening 201 corresponds to the location of one first opening 31 in the first area D1, another opening 201 corresponds to the location of a plurality of adjacent second openings 32 in the second area D2.

When light-emitting layers are formed by a vapor deposition process, the light-emitting layers having the same light emission color can be formed by vapor deposition at the same time. For example, the second light-emitting layers 42 having the same color and having a number corresponding to the number of the second openings 32 may be simultaneously formed by vapor-deposition in an imaginary aperture formed by a periphery of multiple adjacent second openings 32, and at the same time, one first light-emitting layer 41 is formed in each first opening 31.

As shown in FIG. 20B, for the second area D2, three second sub-pixels 42 form a first pixel unit P3 (or P4). The three second sub-pixels 42 are different from one another, and are respectively a red sub-pixel, a green sub-pixel and a blue sub-pixel. The three second sub-pixels 42 are located in two adjacent rows respectively, such as the second row and third row of the second area D2, and the three second sub-pixels 42 are located adjacent to one another. In addition, one of the second sub-pixels 42 is located at a middle position between the other two second sub-pixels 42, and the three second sub-pixels 42 form a "triangle" shape or an inverted "triangle" shape. By controlling light-emitting of one or more of the three second sub-pixels 42, a plurality of different colors can be displayed, and a full-color image display can be realized in the second area.

Figure 20C:
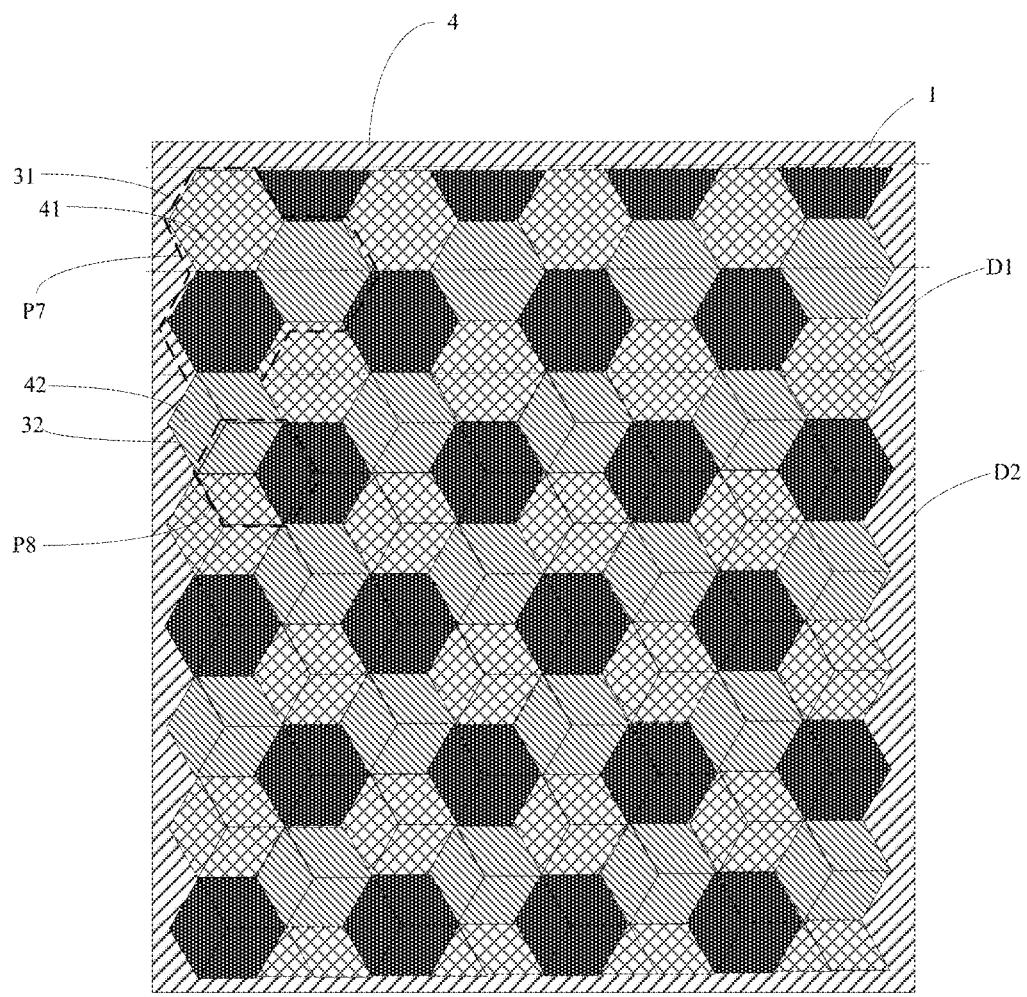

As shown in FIG. 20C, for the second area D2, three second sub-pixels 42 form one second pixel unit P8. The three second sub-pixels 42 are different from one another, and respectively represent a red sub-pixel, a green sub-pixel and a blue sub-pixel. The three second sub-pixels 42 are located in two adjacent rows and are located adjacent to one another. Each second sub-pixel 42 has a rhombus shape. The three second sub-pixels can form a second sub-pixel unit having a regular hexagon shape as shown in the figure.

In order to clearly show the structures of the display structure, the sizes of the structures of the display structure are enlarged. Therefore, the second sub-pixels located at the edges of the second area in FIG. 20B and FIG. 20C don't have complete structures. However, the figures herein are only schematic representations. In practical applications, the size of the second sub-pixel is small, and the second sub-pixels located at the edges of the second area usually have a complete structure.

In an alternative embodiment, the display screen may also comprise three or more display areas, such as three display areas (a first display area, a second display area, and a third display area). The display panel mentioned in any of the above embodiments is used in the first display area. The display panels used in the second display area and the third display area is not limited herein, and the display panels may be a PMOLED display panel or an AMOLED display panel, and certainly, the display panel in any of the embodiments of the present application can also be used.

Optionally, when the display panel in the second display area is an AMOLED display panel, the cathode of the display panel of the first display area and the cathode of the display panel of the second display area share one overall surface electrode. A coplanar cathode makes the manufacture process simple, and the conductivity requirement of the cathode is further reduced. The electrode with better transparency can be used to improve the transparency and improve the overall consistency of the display screen.

The embodiments of the present application further provide a display apparatus comprising the above-mentioned display screen overlaid on an apparatus body. The display apparatus may be a product or a component having a display function, such as a mobile phone, a tablet PC, a television, a display screen, a palmtop computer, an iPod, a digital camera, a navigator, or the like.

FIG. 22 shows a schematic structural view of a display terminal in one embodiment, the display terminal comprises an apparatus body 810 and a display screen 820. The display screen 820 is disposed on the apparatus body 810 and is interconnected with the apparatus body 810. The display screen 820 can be the display screen according to any of the above embodiments, and is used for displaying a static or dynamic image.

FIG. 23 shows a schematic structural view of an apparatus body 810 in an embodiment. In this embodiment of the present application, the apparatus body 810 can be provided with a slotted region 812 and a non-slotted region 814. A photosensitive device such as a camera 930 and a light sensor or the like may be disposed in the slotted region 812. At this time, the display panel of the first display area of the display screen 820 is attached to the slotted region 812 in a corresponding way so that the above-mentioned photosensitive device such as the camera 930 and the light sensor can collect external light through the first display area. Since the display panel in the first display area can effectively alleviate diffraction phenomenon generated by external incident light passing through the first display area, thereby effectively improving the quality of the image captured by the camera 930 on the display apparatus, and preventing image distortion of the captured image due to diffraction, while also improving the accuracy and sensitivity of the light sensor for sensing external light.

The embodiments of the present application further provide a method for driving the display panel in any one of the above embodiments, and the method is applied in a drive Integrated Circuit (IC) to control the displaying of the display panel, as shown in FIG. 24, and the method comprises the following steps S231 and S232:

Step S231: transmitting a scanning signal to a scanning line, so that the scanning line controls a row of the pixel circuits to be turned on simultaneously;

Step S232: transmitting a data signal to a data line such that, when the pixel circuit is turned on, the data line supplies a drive current to the first electrode to control light-emitting of the sub-pixel.

Optionally, luminance of the sub-pixel is controlled by controlling a pulse width of the data line. The drive current of the sub-pixel is adjusted by controlling the pulse width, and the larger the drive current is, the brighter the luminance of the sub-pixel is.

Figure 25:
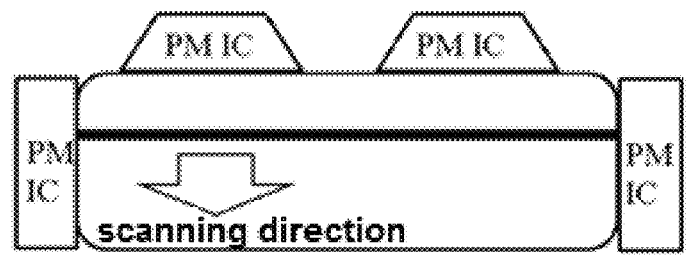
FIG. 25 is a schematic view of a specific example of a driving chip in the method for driving a display panel in the embodiments of the present application.

Optionally, as shown in FIG. 25, the scanning signal and the data signal are transmitted to the scanning line and the data line through a driving chip, and the driving chip may be a PMOLED driving chip (PM IC), and the data signal and the scanning signal are both provided by the PM IC, and the cost is reduced by sharing one IC without using an additional driving chip.

Figure 26:
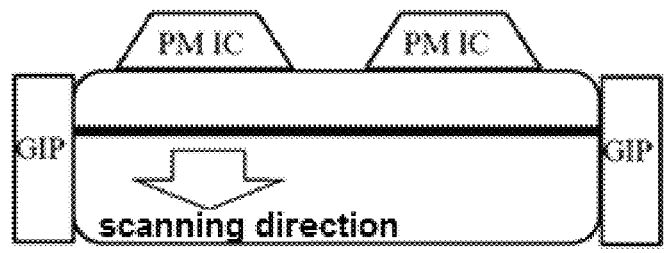
FIG. 26 is a schematic view of another specific example of a driving chip in a method for driving a display panel in the embodiments of the present application.

In an alternative embodiment, as shown in FIG. 26, the data signal is transmitted to the data line through a driving chip, and the driving chip is a PMOLED driving chip (PM IC); the scanning signal is transmitted to a scanning line through a shift register circuit (such as a Gate-in-Panel (GIP) circuit), thus the controlling manner is simple.

Figure 27A:
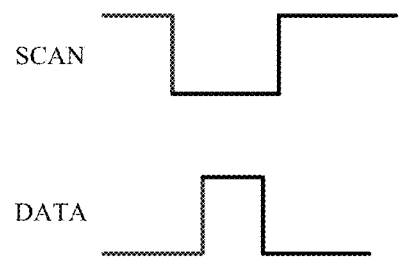
FIG. 27A is a waveform graph of a specific example of a data signal and a scanning signal in a method for driving a display panel in the embodiments of the present application.
Figure 27B:
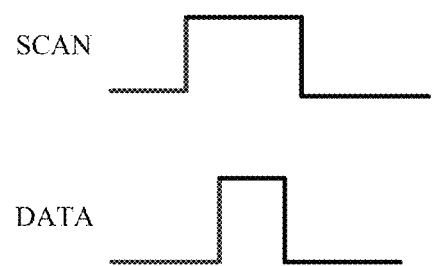
FIG. 27B is a waveform graph of another specific example of a data signal and a scanning signal in a method for driving a display panel in the embodiments of the present application.

The number of PMICs and GIPs shown in FIGS. 25 and 26 is only for illustration purposes and is not limited thereto. The scanning signal and the data signal are generated by the IC of the PMOLED; a current at the time of charging and discharging of the light emitting device needs to be calculated to determine the aspect ratio and voltage of the switching device; the specific voltage setting is determined by the IC output capability and a simulation test. When the switching device is a P-type driving TFT, the scanning signal is driven by a low voltage, and the waveforms of the scanning signal and the data signal are shown in FIG. 27A; when the switching device is an N-type driving TFT, the scanning signal is driven by a high voltage, and the waveforms of the scanning signal and the data signal are as shown in FIG. 27B.

The embodiments of the present application further provide a method for driving the display screen in any one of the above embodiments, and the display screen comprises a first display area and a second display area, in other words, the display screen is a composite screen comprising at least two screen parts. As shown in FIG. 28, the method comprises the following steps S271-S273:

Step S271: transmitting a first scanning signal to a scanning line in a first display area, so that the scanning line controls a row of pixel circuits to be turned on simultaneously;

Step S272: transmitting a first data signal to a data line in the first display area, so that when the pixel circuit is turned on, the data line supplies a drive current to the first electrode to control light-emitting of the sub-pixel;

Step S273: transmitting a second scanning signal to a scanning line in the second display area, and transmitting a second data signal to a data line in the second display area, and the first scanning signal and the second scanning signal are synchronized. In order to ensure that the first display area and the second display area display corresponding content, it is necessary to drive the first display area and the second display area for displaying by synchronous signals. In other words, triggering signals having the same triggering time are provided to start a scanning process in both the first display area and the second display area. However the first scanning signal may have a frequency different from that of the second scanning signal, preferably, the frequency of the first scanning signal is an integer multiple of the frequency of the second scanning signal, or the frequency of the second scanning signal is an integer multiple of the frequency of the first scanning signal. Thus, the scanning signals can be triggered at the same time, which is beneficial for the synchronous displaying of images.

Optionally, a first scanning signal and a first data signal are transmitted by a first driving chip, and a second scanning signal and a second data signal are transmitted by a second driving chip, and the first driving chip is a PMOLED driving chip. The type of the second driving chip can be determined according to the type of the panel in the second display area. If the panel in the second display area is an AMOLED panel, the second driving chip is an AMOLED driving chip, and if the panel in the second display area is a PMOLED panel, the second driving chip is a PMOLED driving chip.

Optionally, a dedicated driving chip may also be applied according to the types of the panels in the first display area and the second display area, such that the first scanning signal, the first data signal, the second scanning signal and the second data signal can be transmitted by the same driving chip. Synchronization of the first scanning signal and the second scanning signal can be realized in this dedicated chip.

In an alternative embodiment, when the display panel in the second display area is an AMOLED display panel, a second scanning signal is transmitted to a scanning line in the second display area, and a second data signal is transmitted to a data line in the second display area. Specifically, the second scanning signal is transmitted to a scanning line in the second display area, and the second data signal is transmitted to a data line in the second display area, so as to control the current on the power line to be input to the corresponding sub-pixels through the driving transistors, thus controlling the light-emitting of the corresponding sub-pixels, thereby achieving a separate control of the composite screen.

As another alternative embodiment, when the composite screen comprises three or more screen parts, the composite screen can be controlled in a manner that each separate display area is driven separately and the synchronous display thereof is controlled by a synchronization signal. The above manner also falls within the protection scope of the present application.

In addition, if the area size of the first display area is much smaller than the displaying area size of the second display area, the scanning manner of the second display area may not be limited to top-to-bottom or bottom-to-top scanning manners as shown in FIG. 25 and FIG. 26. In order to facilitate display synchronization of the first display area and the second display area, a scan can be started from a middle position of the second display area and proceed sequentially towards both ends.

Although the embodiments of the present application have been described with reference to the appended drawings, various modifications and variations can be made by a person skilled in the art without departing from the gist and scope of the present application. Such modifications and variations fall within the scope defined by the attached claims.

What is claimed is:

1. A display panel, comprising:
   a substrate, having a plurality of pixel circuits provided thereon;
   a pixel-defining layer, having a plurality of first openings defined therein;
   a light-emitting structure layer, disposed in the plurality of first openings to form a plurality of sub-pixels;
   a first electrode layer, disposed on the pixel circuits and comprising a plurality of first electrodes;
   a second electrode, disposed on the light emitting structure layer and being a surface electrode; and a scanning line and a data line both connected to each of the pixel circuits;

wherein, the plurality of sub-pixels forms a plurality of sub-pixel rows and a plurality of sub-pixel columns, sub-pixels in adjacent sub-pixel rows are staggered with one another and/or sub-pixels in adjacent sub-pixel columns are staggered with one another;

the pixel circuits have a one-to-one correspondence relationship with the first electrodes, and the sub-pixels have a one-to-one correspondence relationship with the first electrodes;

the scanning line supplies a voltage to the pixel circuit to control turning-on and turning-off of the pixel circuit, and when the pixel circuit is turned on, a drive current from the data line is directly supplied to the plurality of first electrodes to control light-emitting of the corresponding sub-pixel, wherein at least one scanning line extends along a first direction, at least one data line extends along a second direction, the first direction intersects with the second direction, wherein both side edges of each of the scanning lines in the extending direction thereof have a wave shape, and each scanning line has oppositely disposed wave crests and oppositely disposed wave troughs on both of its side edges, and the adjacent two side edges of every two neighboring scanning lines have oppositely disposed wave crests and oppositely disposed wave troughs such that a first distance between every two neighboring scanning lines changes continuously or intermittently; and/or both side edges of each of the data lines in the extending direction thereof have a wave shape, and each data line has oppositely disposed wave crests and oppositely disposed wave troughs on both of its side edges, and the adjacent two side edges of every two neighboring data lines have oppositely disposed wave crests and oppositely disposed wave troughs such that a second distance between every two neighboring data lines changes continuously or intermittently.

2. The display panel according to claim 1, wherein the first electrodes of the sub-pixels are disposed on the same layer as the data line, the first electrodes and the data line are formed in a same process step, the data line is disposed between the corresponding first electrodes, and the data line extends along an extending direction not parallel to the sides of the first electrodes.

3. The display panel according to claim 1, wherein the data line is disposed below the first electrodes, a projection of the data line on the substrate is a first projection, and a projection of each sub-pixel of the light emitting structure layer on the substrate is a second projection, and each of the first projections traverses multiple ones of the second projections.

4. The display panel according to claim 1, wherein the pixel circuit only comprises a switching device.

5. The display panel according to claim 4, wherein the pixel circuit comprises one switching device, and the switching device comprises a first terminal, a second terminal, and a control terminal; and the scanning line is connected to the control terminal of the switching device, the data line is connected to the first terminal of the switching device, and the plurality of first electrodes is connected to the second terminal of the switching device.

6. The display panel according to claim 5, wherein the plurality of first electrodes is anode, the second electrode is a cathode; the switching device is a driving thin film transistor, and the first terminal is a source electrode or a drain electrode of the driving thin film transistor, the second terminal is a drain electrode or a source electrode of the driving thin film transistor, the control terminal is a gate electrode of the driving thin film transistor; and the driving thin film transistor has a top gate structure or a bottom gate structure.

7. The display panel according to claim 6, wherein the driving thin film transistor is an oxide thin film transistor or a low temperature polycrystalline silicon thin film transistor.

8. The display panel according to claim 6, wherein one or more of the first electrodes, the second electrode, the data line and the scanning line are made of a transparent conductive material; and the transparent conductive material has a light transmittance of greater than 90%.

9. The display panel according to claim 8, wherein the transparent conductive material is indium tin oxide, indium zinc oxide, silver-doped indium tin oxide, or silver-doped indium zinc oxide.

10. The display panel according to claim 9, wherein, when the gate electrode is made of a transparent conductive material, the scanning line and the gate electrode are formed in the same process step; or, when the gate electrode is made of a metal material, the scanning line is disposed above or below the gate electrode.

11. The display panel according to claim 1, wherein a width of the scanning line changes continuously or intermittently; and/or a width of the data line changes continuously or intermittently.

12. The display panel according to claim 1, wherein a first connecting portion is formed at a position where the wave troughs of the two side edges of the scanning line are oppositely disposed, the first connecting portion is strip-shaped, and the first connecting portion is an area electrically connecting the scanning line to the switching device; and/or a second connecting portion is formed at a position where the wave troughs of the two side edges of the data line are oppositely disposed, the second connecting portion is strip-shaped, and the second connecting portion is an area electrically connecting the data line to the switching device.

13. A display screen, comprising at least a first display area and a second display area used to display a dynamic or static image, and a photosensitive device being disposed below the first display area;

wherein, the first display area is provided with a first display panel, and the second display area is provided with a passive matrix organic light emitting diode display panel or an active matrix organic light emitting diode display panel, wherein the first display panel comprises:

a substrate, having a plurality of pixel circuits provided thereon;

a pixel-defining layer, having a plurality of first openings defined therein;

a light-emitting structure layer, disposed in the plurality of first openings to form a plurality of sub-pixels;

a first electrode layer, disposed on the pixel circuits and comprising a plurality of first electrodes;

a second electrode, disposed on the light emitting structure layer and being a surface electrode; and a scanning line and a data line both connected to each of the pixel circuits;

wherein, the plurality of sub-pixels forms a plurality of sub-pixel rows and a plurality of sub-pixel columns, sub-pixels in adjacent sub-pixel rows are staggered with one another and/or sub-pixels in adjacent sub-pixel columns are staggered with one another;

the pixel circuits have a one-to-one correspondence relationship with the first electrodes, and the sub-pixels have a one-to-one correspondence relationship with the first electrodes;

the scanning line supplies a voltage to the pixel circuit to control turning-on and turning-off of the pixel circuit, and when the pixel circuit is turned on, a drive current from the data line is directly supplied to the plurality of first electrodes to control light-emitting of the corresponding sub-pixel, wherein at least one scanning line extends along a first direction, at least one data line extends along a second direction, the first direction intersects with the second direction, both side edges of each of the scanning lines in the extending direction thereof have a wave shape, and each scanning line has oppositely disposed wave crests and oppositely disposed wave troughs on both of its side edges, and the adjacent two side edges of every two neighboring scanning lines have oppositely disposed wave crests and oppositely disposed wave troughs such that a first distance between every two neighboring scanning lines changes continuously or intermittently; and/or both side edges of each of the data lines in the extending direction thereof have a wave shape, and each data line has oppositely disposed wave crests and oppositely disposed wave troughs on both of its side edges, and the adjacent two side edges of every two neighboring data lines have oppositely disposed wave crests and oppositely disposed wave troughs such that a second distance between every two neighboring data lines changes continuously or intermittently.

14. The display screen according to claim 13, wherein
the first display area has a resolution lower than that of the second display area;
a pixel-defining layer defines a plurality of first openings in the first display area, and defines a plurality of second openings in the second display area, and each of the second openings has an area smaller than that of each of the first openings;
first sub-pixels having number and positions corresponding to that of the first openings are formed in the first display area, and second sub-pixels having number and positions corresponding to that of the second openings are formed in the second display area, and a light emitting structure layer of the first sub-pixels and a light emitting structure layer of the second sub-pixels are formed in the same process step by using the same mask.

15. The display screen according to claim 13, wherein, when the second display area is provided with an active matrix organic light emitting diode display panel, the cathode of the display panel of the first display area and the cathode of the display panel of the second display area share one overall surface electrode.

16. The display screen according to claim 13, wherein
a width of the scanning line changes continuously or intermittently; and/or
a width of the data line changes continuously or intermittently.

17. The display screen according to claim 13, wherein the pixel circuit only comprises a switching device.

18. The display screen according to claim 17, wherein
a first connecting portion is formed at a position where the wave troughs of the two side edges of the scanning line are oppositely disposed, the first connecting portion is strip-shaped, and the first connecting portion is an area electrically connecting the scanning line to the switching device; and/or
a second connecting portion is formed at a position where the wave troughs of the two side edges of the data line are oppositely disposed, the second connecting portion is strip-shaped, and the second connecting portion is an area electrically connecting the data line to the switching device.

* * * * *